(12) United States Patent
Arao et al.

(10) Patent No.: US 7,531,784 B2
(45) Date of Patent: May 12, 2009

(54) SEMICONDUCTOR DEVICE AND ELECTRONIC APPLIANCE USING THE SAME

(75) Inventors: Tatsuya Arao, Kanagawa (JP); Atsushi Hirose, Kanagawa (JP); Kazuo Nishi, Yamanashi (JP); Yuusuke Sugawara, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 40 days.

(21) Appl. No.: 11/790,482

(22) Filed: Apr. 25, 2007

(65) Prior Publication Data
US 2007/0257248 A1 Nov. 8, 2007

(30) Foreign Application Priority Data
Apr. 27, 2006 (JP) ............................. 2006-122993

(51) Int. Cl.
H01J 40/14 (2006.01)
(52) U.S. Cl. ............................. 250/214 A; 250/214 LS; 330/308
(58) Field of Classification Search ............ 250/214 R, 250/214 A, 214 LA, 214 LS, 214 C; 330/288, 330/308, 59; 327/514
See application file for complete search history.

(56) References Cited

U.S. PATENT DOCUMENTS

| | | | |
|---|---|---|---|
| 4,065,668 A | 12/1977 | Monticelli | |
| 4,118,621 A * | 10/1978 | Monticelli et al. | ...... 250/214 A |
| 4,454,416 A * | 6/1984 | Gontowski et al. | ...... 250/214 A |
| 4,713,819 A | 12/1987 | Yoshikawa | |
| 5,059,809 A * | 10/1991 | Fukuyama | ................... 250/551 |
| 5,479,208 A | 12/1995 | Okumura | |
| 5,760,760 A | 6/1998 | Helms | |
| 5,936,231 A | 8/1999 | Michiyama et al. | |
| 5,952,992 A | 9/1999 | Helms | |
| 5,981,936 A | 11/1999 | Fujiie | |
| 6,057,738 A | 5/2000 | Ku et al. | |
| 6,287,888 B1 | 9/2001 | Sakakura et al. | |

(Continued)

FOREIGN PATENT DOCUMENTS

DE       9213278        1/1993

(Continued)

OTHER PUBLICATIONS

International Search Report (Application No. PCT/JP2007/059007) dated May 22, 2007.

(Continued)

*Primary Examiner*—Kevin Pyo
(74) *Attorney, Agent, or Firm*—Eric J. Robinson; Robinson Intellectual Property Law Office, P.C.

(57) ABSTRACT

An object is to provide a photoelectric conversion device capable of detecting a wider range of illuminance without expansion of a range of an output voltage or output current. The photoelectric conversion device has a photoelectric conversion device including a photoelectric conversion element and an amplifier circuit electrically connected to the photoelectric conversion element, and a bias switching unit for reversing a bias to be applied to the photoelectric conversion device. The bias to be applied to the photoelectric conversion device is reversed with use of the bias switching unit, whereby the photoelectric conversion device can detect a wider range of illuminance without expansion of a range of an output voltage or output current.

16 Claims, 28 Drawing Sheets

U.S. PATENT DOCUMENTS

| | | |
|---|---|---|
| 6,363,044 B1 | 3/2002 | Lehr et al. |
| 6,531,771 B1 | 3/2003 | Monticelli et al. |
| 7,002,881 B2 | 2/2006 | Okuda et al. |
| 7,030,551 B2 | 4/2006 | Yamazaki et al. |
| 2002/0000631 A1 | 1/2002 | Sakakura et al. |
| 2002/0044208 A1 | 4/2002 | Yamazaki et al. |
| 2003/0231574 A1 | 12/2003 | Okuda et al. |
| 2004/0042707 A1 | 3/2004 | Imai et al. |
| 2004/0114719 A1 | 6/2004 | Endo |
| 2005/0082463 A1 | 4/2005 | Koyama et al. |
| 2005/0116310 A1 | 6/2005 | Nishi et al. |
| 2005/0167573 A1 | 8/2005 | Maruyama et al. |
| 2006/0163577 A1 | 7/2006 | Yamazaki et al. |
| 2006/0261253 A1 | 11/2006 | Arao et al. |
| 2007/0045672 A1 | 3/2007 | Nishi et al. |

FOREIGN PATENT DOCUMENTS

| | | |
|---|---|---|
| EP | 0 445 757 | 9/1991 |
| EP | 1 523 043 | 4/2005 |
| EP | 1 727 120 | 11/2006 |
| JP | 60-020655 | 2/1985 |
| JP | 03-257794 | 11/1991 |
| JP | 09-329493 | 12/1997 |
| JP | 10-256841 | 9/1998 |
| JP | 2003-315149 | 11/2003 |
| JP | 2004-022051 | 1/2004 |
| JP | 2005-136394 | 5/2005 |
| JP | 2005-167157 | 6/2005 |
| JP | 2007/005774 | 1/2007 |
| JP | 2007-059889 | 3/2007 |
| WO | WO 2005/114749 | 12/2005 |
| WO | WO 2007/013534 | 2/2007 |

OTHER PUBLICATIONS

Written Opinion (Application No. PCT/JP2005/059007) dated May 22, 2007.

Search Report (Application No. 06009252.5 Dec. 15 2006).

* cited by examiner

SEMICONDUCTOR DEVICE AND ELECTRONIC APPLIANCE USING THE SAME

TECHNICAL FIELD

The present invention relates to a semiconductor device, in particular, a semiconductor device including a photoelectric conversion device and a transistor. Further, the present invention relates to an electronic appliance using the semiconductor device.

BACKGROUND ART

A number of photoelectric conversion devices generally used for sensing an electromagnetic wave are known, and for example, a photoelectric conversion device having sensitivity in ultra-violet rays to infrared rays is collectively referred to as an optical sensor. An optical sensor having sensitivity in a visible light region with a wavelength of 400 to 700 nm is particularly referred to as a visible light sensor, and a large number of visible light sensors are used for devices which need illuminance adjustment, on/off control, or the like depending on human living environment.

In particular, in a display device, brightness in the periphery of the display device is detected to adjust display luminance thereof. This is because unnecessary electric-power can be reduced by detecting peripheral brightness and obtaining appropriate display luminance. For example, such an optical sensor for adjusting luminance is used for a mobile phone or a personal computer.

In addition, as well as peripheral brightness, luminance of a backlight of a display device, in particular, a liquid crystal display device is also detected by an optical sensor to adjust luminance of a display screen.

In such an optical sensor, a photodiode is used for a sensing part and an output current of the photodiode is amplified in an amplifier circuit. As such an amplifier circuit, for example, a current mirror circuit is used (for example, see Patent Document 1: Japanese Patent No. 3444093).

DISCLOSURE OF INVENTION

In a case of a conventional optical sensor, when detection is attempted for higher illuminance, an output current or an output voltage ranges widely; therefore, the following problems are given: the conventional optical sensor is not easily used as a photoelectric conversion device, and power consumption is increased.

In view of the foregoing problems, an object of the invention is to obtain a photoelectric conversion device capable of detecting a wider range of illuminance without expansion of an output voltage or output current.

A semiconductor device of the invention has a photoelectric conversion device that includes a photoelectric conversion element and an amplifier circuit electrically connected to the photoelectric conversion element, and a bias switching unit that reverses a bias to be applied to the photoelectric conversion device. By reversal of a bias to be applied to the photoelectric conversion device with use of the bias switching unit, a wider range of illuminance can be detected without expansion of a range of an output voltage or output current.

Note that the amplifier circuit has two or more transistors including at least a first transistor; incident light is sensed by the photoelectric conversion element; and a bias to be applied to the photoelectric conversion device is reversed and at the same time, detection by a current generated in the photoelectric conversion element and detection by a voltage generated in the photoelectric conversion element, which is applied between a gate and a source of the first transistor, are switched. Therefore, a property of the transistor included in the photoelectric conversion device, such as crystallinity of a channel formation region, a threshold value, or an S value (subthreshold value) is changed, whereby a range of detectable illuminance, an output current, an output voltage, and the like can be changed in accordance with a purpose.

One mode of the invention is a semiconductor device having an illuminance detecting function, and the semiconductor device has a photoelectric conversion device including a photoelectric conversion element and an amplifier circuit electrically connected to the photoelectric conversion element, and a bias switching unit for reversing a bias to be applied to the photoelectric conversion device. The amplifier circuit has two or more transistors including at least a first transistor. A gate electrode of the first transistor is electrically connected to a first electrode of the first transistor through the photoelectric conversion element. The photoelectric conversion element senses incident light. The bias switching unit reverses a bias at a predetermined level of illuminance, and at the same time, switches between detection by a current generated in the photoelectric conversion element and detection by a voltage generated in the photoelectric conversion element, which is applied between a gate and a source of the first transistor.

Another mode of the invention is a semiconductor device having an illuminance detecting function, and the semiconductor device has a photoelectric conversion device including a photoelectric conversion element and an amplifier circuit electrically connected to the photoelectric conversion element, and a bias switching unit for reversing a bias to be applied to the photoelectric conversion device. The amplifier circuit has two or more transistors including at least a first transistor. The photoelectric conversion element senses incident light. In a case where an illuminance level is a predetermined level or lower, the light is detected by a current generated in the photoelectric conversion element, whereas in a case where an illuminance level is higher than a predetermined level, the light is detected by application of a voltage generated in the photoelectric conversion element between a gate and a source of the first transistor. The bias switching unit reverses a bias at a predetermined level of illuminance.

Another mode of the invention is a semiconductor device having an illuminance detecting function, and the semiconductor device has a photoelectric conversion device including a photoelectric conversion element and an amplifier circuit electrically connected to the photoelectric conversion element, and a bias switching unit for reversing a bias to be applied to the photoelectric conversion device. The amplifier circuit has two or more transistors including at least a first transistor. A gate electrode of the first transistor is electrically connected to a first electrode of the first transistor through the photoelectric conversion element. The photoelectric conversion element senses incident light. In a case where an illuminance level is a predetermined level or lower, the light is detected by a current generated in the photoelectric conversion element, whereas in a case where an illuminance level is higher than a predetermined level, the light is detected by application of a voltage generated in the photoelectric conversion element between a gate and a source of the first transistor. The bias switching unit reverses a bias at a predetermined level of illuminance.

Another mode of the invention is a semiconductor device having an illuminance detecting function, and the semiconductor device has a photoelectric conversion device including a photoelectric conversion element and an amplifier circuit electrically connected to the photoelectric conversion element, and a bias switching unit for reversing a bias to be applied to the photoelectric conversion device. The amplifier circuit has at least a first transistor and a second transistor. A bias is applied through a first terminal and a second terminal of the photoelectric conversion device. The first terminal is electrically connected to a first electrode and a gate electrode of the second transistor and a gate electrode of the first transistor through the photoelectric conversion element, and is also electrically connected to a first electrode of the first transistor. The second terminal is electrically connected to second electrodes of the first transistor and the second transistor. The photoelectric conversion element senses incident light. In a case where an illuminance level is a predetermined level or lower, the light is detected by a current generated in the photoelectric conversion element, whereas in a case where an illuminance level is higher than a predetermined level, the light is detected by a voltage generated in the photoelectric conversion element. The bias switching unit reverses a bias at a predetermined level of illuminance.

In the aforementioned structure, the amplifier circuit has a plurality of first transistors. In addition, the photoelectric conversion element has a p-type semiconductor layer, an n-type semiconductor layer, and an i-type semiconductor layer provided between the p-type semiconductor layer and the n-type semiconductor layer.

Note that in this specification, "being connected" means "being electrically connected". Therefore, in the structure disclosed in the invention, another element which enables an electrical connection (for example, a switch, a transistor, a capacitor, an inductor, a resistor, a diode, or the like) may be interposed in the predetermined connection. It is needless to say that elements may be provided without another element being interposed, and "being electrically connected" means also "being directly connected".

Note that in this specification, in order to reverse a bias to be applied to a photoelectric conversion device, potentials to be applied to the photoelectric conversion device may be reversed, and a potential difference is not always required to be the same before and after a reversal. Further, in this specification, description is made of a case where a transistor is a thin film transistor; however, it is not particularly limited thereto.

By the invention, a wider range of illuminance can be detected without expansion of a range of an output voltage or output current. Accordingly, a high-performance photoelectric conversion device can be obtained.

BRIEF DESCRIPTION OF DRAWINGS

FIGS. 23A and 22B are diagrams each showing a bias switching unit.

BEST MODE FOR CARRYING OUT THE INVENTION

Figure 1A:
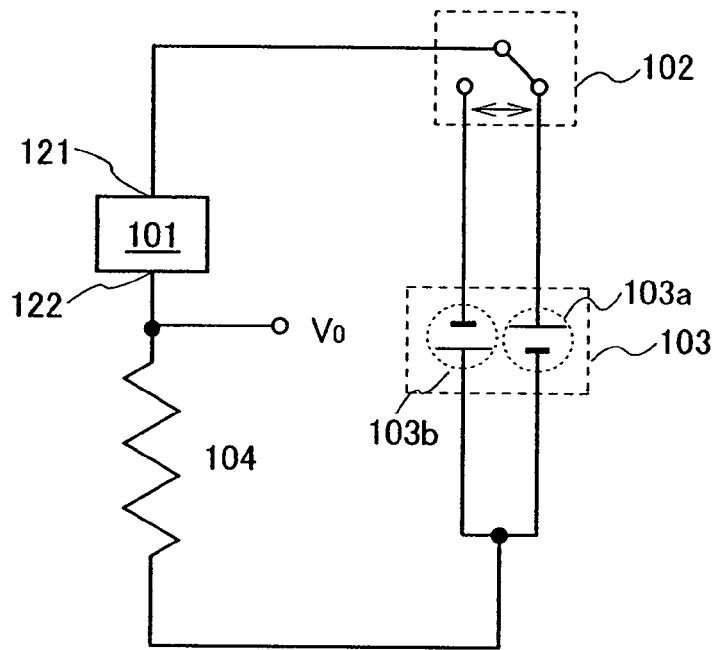
FIGS. 1A and 1B are diagrams showing a semiconductor device of the invention.

Although the invention will be fully described by way of an embodiment mode and embodiments with reference to the accompanying drawings, it is to be understood that various changes and modifications will be apparent to those skilled in the art. Therefore, unless such changes and modifications depart from the spirit and the scope of the invention, they should be construed as being included therein. Note that in a structure of the present invention described below, common portions and portions having a similar function are denoted by the same reference numerals in all diagrams, and description thereof is omitted.

Embodiment Mode

A semiconductor device of Embodiment Mode 1 of the invention is described with reference to FIGS. 1A and 1B. A semiconductor device shown in FIG. 1A has a photoelectric conversion device 101, a bias switching unit 102, a power source 103, a terminal $V_0$, and a resistor 104. Note that the photoelectric conversion device 101 has a thin film integrated circuit including a photoelectric conversion element 115 and thin film transistors (TFT), and the thin film integrated circuit has at least a current mirror circuit 114 including a thin film transistor 113 and a diode-connected thin film transistor 112. Note that in this embodiment mode, each thin film transistor included in the current mirror circuit 114 is an n-channel thin film transistor. In addition, the photoelectric conversion device is also referred to as a photo IC.

One terminal 121 of the photoelectric conversion device 101 is connected to one electrode of the power source 103 through the bias switching unit 102, and the other terminal 122 of the photoelectric conversion device 101 is connected to the other electrode of the power source 103 through the resistor 104. Note that a current obtained from the photoelectric conversion device 101 is outputted as a voltage from the terminal $V_O$ connected to the terminal 121, with use of the resistor 104.

Next, the photoelectric conversion device 101 is described with reference to FIG. 1B. The terminal 121 is connected to a gate electrode and a first electrode (one of a source electrode and a drain electrode) of the thin film transistor 112 through the photoelectric conversion element 115. A second electrode (the other of the source electrode and the drain electrode) of the thin film transistor 112 is connected to the terminal 122. In addition, the terminal 121 is also connected to a first electrode (one of a source electrode and a drain electrode) of the thin film transistor 113. Meanwhile, a second electrode (the other of the source electrode and the drain electrode) of the thin film transistor 113 is connected to the terminal 122. Note that a gate electrode of the thin film transistor 113 is connected to the gate electrode of the thin film transistor 112.

In the semiconductor device shown in FIG. 1A, the photoelectric conversion element 115 is irradiated with light, whereby an electron and a hole are generated, and a current is generated. Note that the current mirror circuit 114 has a function of amplifying the current obtained from the photoelectric conversion element 115. FIG. 1B shows a case of one thin film transistor 113, that is, a case where a current obtained from the photoelectric conversion element 115 is amplified to be doubled. When a further higher current is necessary, a plurality of units 116 each including the thin film transistor 113 that has a gate electrode connected to the gate electrode of the thin film transistor 112 may be provided in parallel between the terminals 121 and 122. For example, when the number of units is set to n as shown in FIG. 2 and a current obtained from the photoelectric conversion element 115 is set to i, approximately (n+1) times the current, approximately (n+1)×i, can be outputted from the photoelectric conversion device 101. Note that the current obtained from the photoelectric conversion element 115 has illuminance dependency; therefore, illuminance, that is, irradiation light can be detected. Here, the current obtained from the photoelectric conversion device 101 is outputted as a voltage from the terminal $V_O$ with use of the resistor 104, and thus illuminance is detected.

The bias switching unit 102 reverses potentials to be applied to the terminals 121 and 122 of the photoelectric conversion device 101, that is, a bias at a predetermined level of illuminance, with use of the power source 103. In FIGS. 1A and 1B, two kinds of power sources 103a and 103b are used. As long as the bias to be applied to the photoelectric conversion device 101 is reversed, usable power sources are not particularly limited to them. It is needless to say that the voltage to be applied to the photoelectric conversion device 101 is not always required to be the same before and after a reversal.

Further, by reversal of a bias to be applied to the photoelectric conversion device 101, an output voltage outputted from the terminal $V_O$ is also reversed; therefore, an output may be obtained from the terminal $V_O$ through a switching unit for reversing an output (not shown).

Figure 3A:
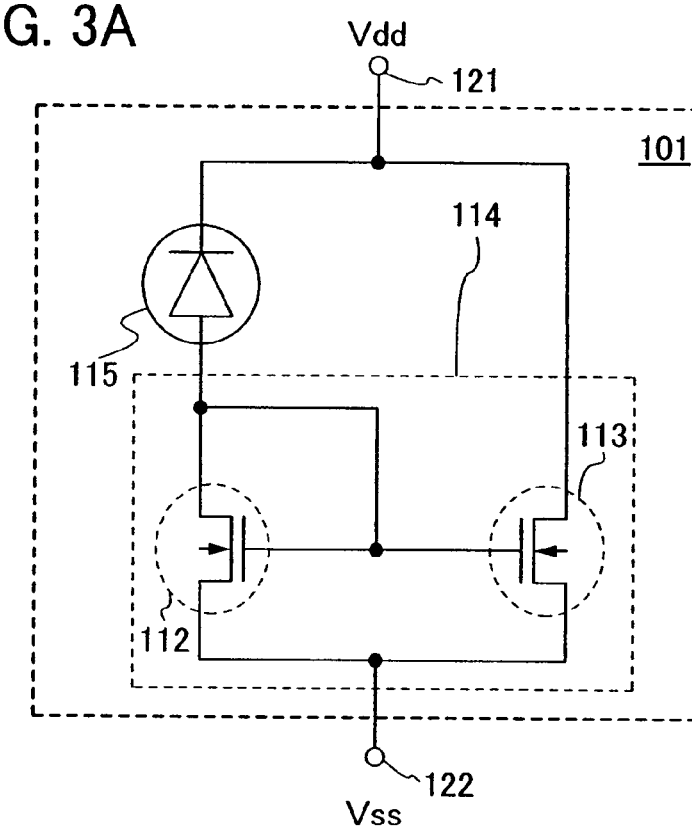
FIGS. 3A and 3B are diagrams each showing a photoelectric conversion device of the invention.

Light detection in a case where a voltage is applied to the photoelectric conversion device 101 with use of the power source 103a is described, taking the photoelectric conversion device 101 of the semiconductor device, with reference to FIG. 3A. Note that a potential Vdd is supplied to the terminal 121 connected to a positive electrode side of the power source 103a, whereas a potential Vss is supplied to the terminal 122 connected to a negative electrode side. In this case, the first electrode of the thin film transistor 113 functions as a drain electrode, and the second electrode thereof functions as a source electrode. In an initial state where light is not irradiated, the thin film transistor 112 and the thin film transistor 113 are electrically disconnected.

Figure 4:
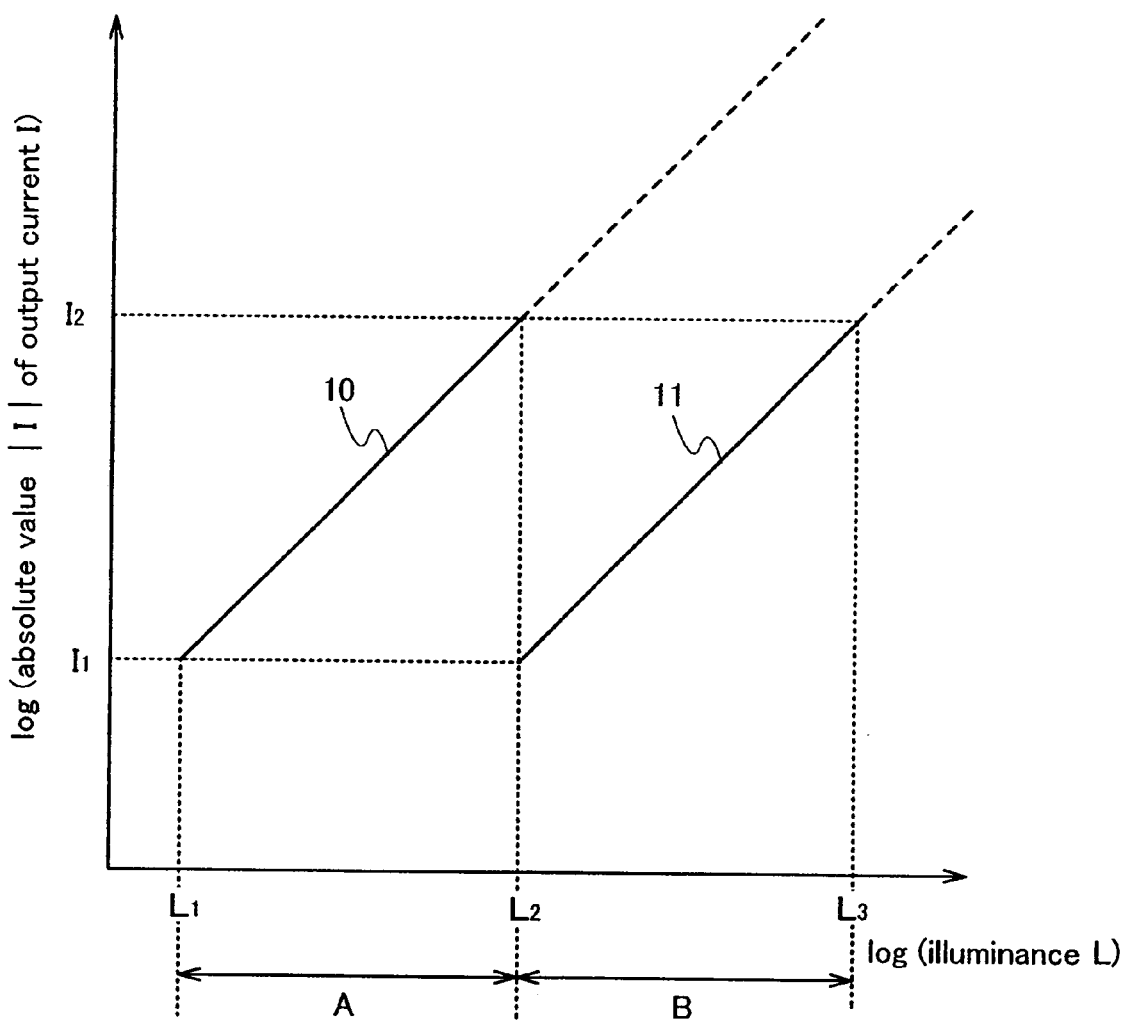
FIG. 4 is a diagram showing illuminance dependency with respect to an output current of a photoelectric conversion device of the invention.

When the photoelectric conversion element 115 is irradiated with light, a current can be obtained, the thin film transistor 112 becomes conductive, and the current i flows to the thin film transistor 112, as described above. Note that in this case, the first electrode of the thin film transistor 112 is a drain electrode, the second electrode thereof is a source electrode, and the thin film transistor 112 is diode-connected. Further, a potential approximately equal to those of the gate electrode and the source electrode of the thin film transistor 112 is supplied to each of the gate electrode and the source electrode of the thin film transistor 113; therefore, the current i flows. Accordingly, an approximately 2×i current value I can be obtained from the photoelectric conversion device 101. FIG. 4 (reference numeral 10 in FIG. 4) shows a relation of the current value |I| obtained from the photoelectric conversion device 101 (that is, an output current |I|) to illuminance in that case. In FIG. 4, the horizontal axis and the vertical axis indicate illuminance L and a current value |I| that are expressed logarithmically, respectively. Note that the current value |I| denotes the absolute value of the current value I. When light is detected, if an output voltage from the semiconductor device, that is, an output voltage from the terminal $V_O$ in FIG. 1A is set to V1 or higher and V2 or lower and the range of a detectable current from the photoelectric conversion device 101 is set to I1 or larger and I2 or smaller, detectable illuminance in the semiconductor device in the case of using the power source 103a is L1 or higher and L2 is lower, that is, within a range A.

Figure 3B:
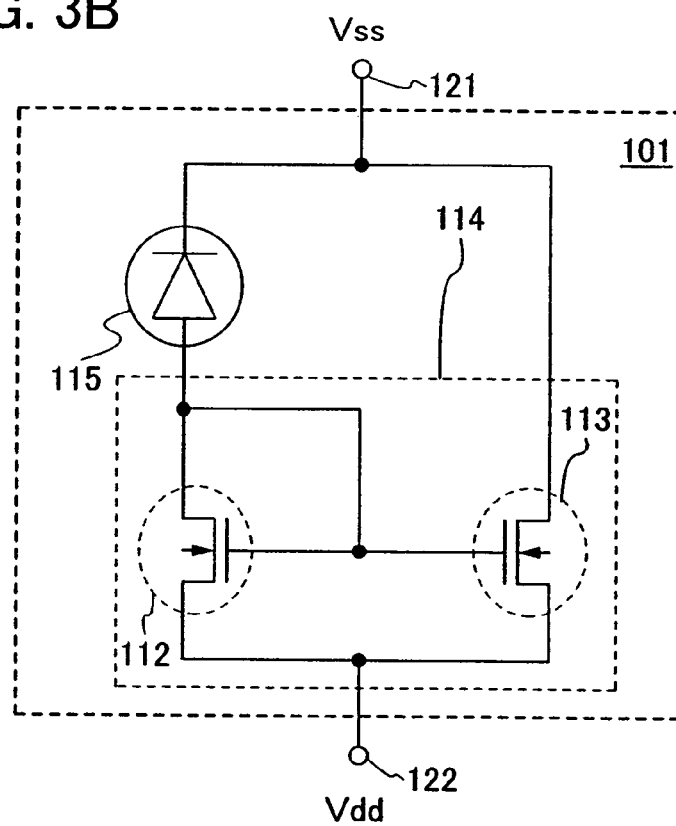

Next, description is made of a case where a predetermined level of illuminance at which the power source 103 is switched by the bias switching unit 102 shown in FIG. 1A is L2. Since the power source 103 is switched, a power source 103b is used, and the photoelectric conversion device 101 in this case is shown in FIG. 3B. Note that a potential Vss is supplied to the terminal 121 connected to a negative electrode side of the power source 103b and a potential Vdd is supplied to the terminal 122 connected to a positive electrode side thereof. In other words, a bias to be applied to the photoelectric conversion device 101 is reversed with respect to that in a case of the power source 103a shown in FIG. 3A. In this case, the first electrode of the thin film transistor 113 functions as a source electrode, and the second electrode thereof functions as a drain electrode. In an initial state where light is not emitted, the thin film transistor 112 and the thin film transistor 113 are electrically disconnected.

When the thin film transistor 112 is in a nonconductive state and the photoelectric conversion element 115 is irradiated with light, an open-ciruit voltage Voc proportional to a logarithmic value of illuminance is generated. Therefore, each potential of the first electrode and the gate electrode of the thin film transistor 112 and the gate electrode of the thin film transistor 113 connected to them is Vss+Voc. Thus, a gate-source voltage of the thin film transistor 113 becomes Voc, whereby the thin film transistor 113 becomes conductive. Then, a current i' flows to the thin film transistor 113. When Vdd>Vss+Voc is satisfied, the first electrode of the thin film transistor 112 is a source electrode, and the second electrode thereof is a drain electrode. Therefore, since a gate-source voltage Vgs of the thin film transistor 112 is 0, the thin film transistor 112 is in a nonconductive state. Note that description is made under the condition that an off current of the thin film transistor 112 is not considered here.

Thus, the current value i' is obtained from the photoelectric conversion device 101. A relation of an output current from the photoelectric conversion device 101 to illuminance in that case is shown as a reference numeral 11 in FIG. 4.

As described above, in this embodiment mode, an output voltage from the semiconductor device, that is, an output voltage from the terminal $V_O$ in FIG. 1A is set to V1 or higher and V2 or lower, and a detectable current is set to I1 or larger and I2 or smaller. Therefore, detectable illuminance in the photoelectric conversion device in the case of using the power source 103b is L2 or higher and L3 is lower, that is, within a range B. Note that for detection of the illuminance L2, either characteristic, the range A or the range B, may be used. Since the predetermined level of illuminance at which the power source 103 is switched is set to L2 here, a range of illuminance in the range B is set to L2<L≦13.

By reversal of a bias to be applied to the photoelectric conversion device in this manner, a wider range of illuminance can be detected without expansion of a range of an output voltage or output current.

Figure 5:
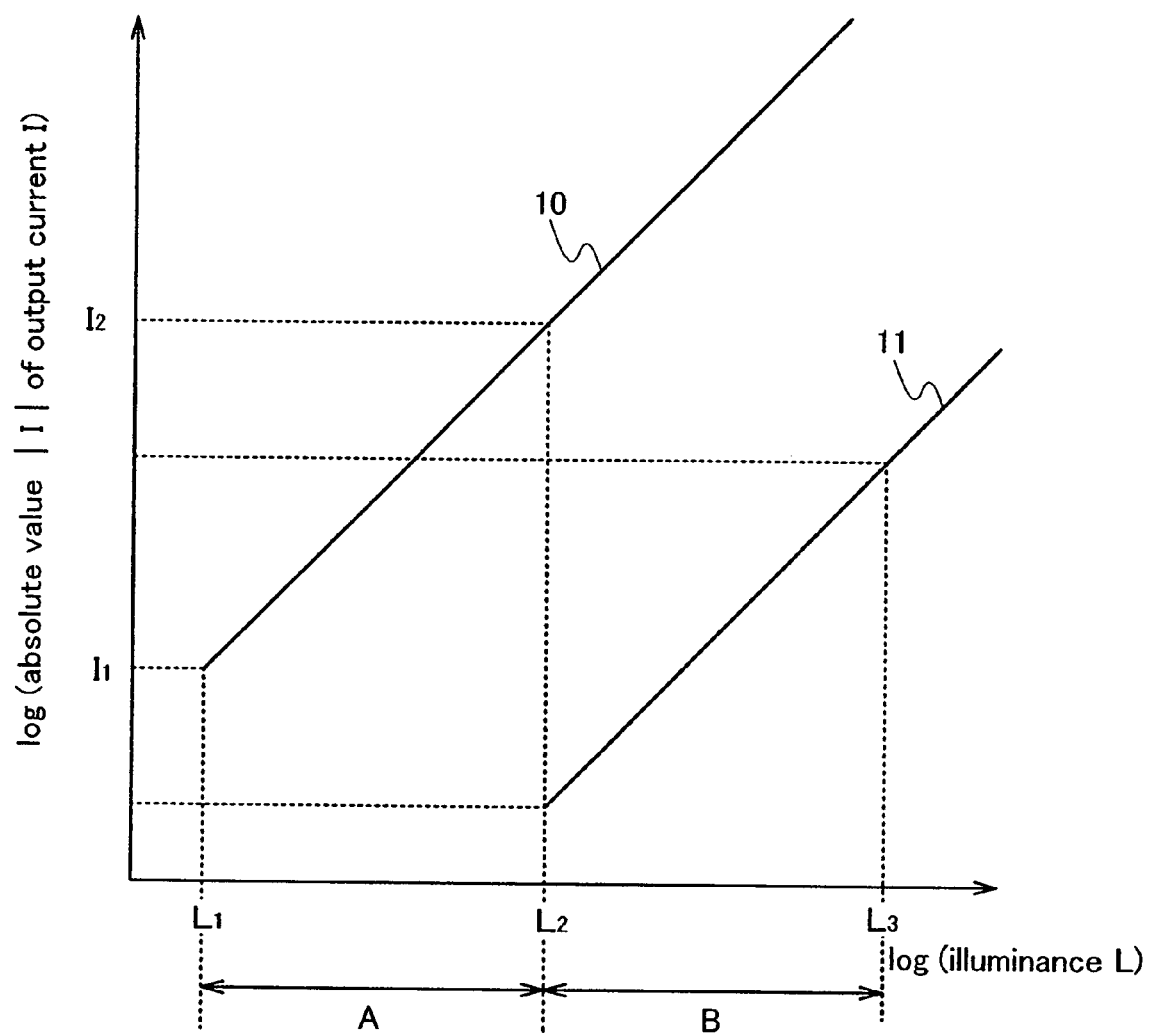
FIG. 5 is a diagram showing illuminance dependency with respect to an output current of a photoelectric conversion device of the invention.

Note that in FIG. 4, description is made of a case where the absolute value |I| of the current value obtained from the photoelectric conversion device 101 is I1 or larger and I2 or smaller in the range B of illuminance; however, there is a case where current values obtained in the ranges A and B differ significantly as shown in FIG. 5. In such a case, a range of an output voltage becomes wide; therefore, the photoelectric conversion device 101 is not easily used as a semiconductor device, and in addition, power consumption is increased.

As described above, for detection of illuminance, characteristics of the photoelectric conversion element 115 are used in the range A, and the open-circuit voltage Voc obtained from the photoelectric conversion element 115 and characteristics of the thin film transistor 112 are used in the range B. Thus, characteristics of the thin film transistor are changed, whereby an output current in the range B can be changed. By control of the characteristics of the thin film transistor, an output current can be obtained within a predetermined range in the range B; therefore, ranges of an output current in the ranges A and B can be more approximated. For example, in a case where a threshold voltage of the thin film transistor 113 is controlled, a relation of an output current to illuminance (reference numeral 11 in FIG. 5) can be shifted in a vertical axis direction. In other words, a current value to be obtained can be increased or decreased in accordance with illuminance. For example, when a threshold voltage of the thin film transistor is changed in a positive direction, an output current (reference numeral 11 in FIG. 5) is shifted in a low direction, whereas when the threshold voltage is changed in a negative direction, an output current (reference numeral 11 in FIG. 5) is shifted in a high direction. It is to be noted that a threshold of the thin film transistor is controlled under the condition that the thin film transistor is a depletion transistor, that is, in a range where the thin film transistor is not normally on. Thus, an output current can be set freely; therefore, a wider range of illuminance can be detected without expansion of a range of an output current or output voltage.

In addition, by control of an S value (subthreshold value) of the thin film transistor, a slope of a relation of an output current to illuminance (reference numeral 11 in FIG. 5) can be set freely. For example, when the S value is large, the slope of 11 in FIG. 5 can be gentle, whereas when the S value is small, the slope of 11 in FIG. 5 can be sharp. Therefore, an output current with respect to illuminance in the range A and that in the range B can be the same or different. For example, in the latter case, when high illuminance is detected, illuminance dependency can be lowered compared with in the case of low illuminance, and in such a case, a range of detectable light of the semiconductor device can be further expanded. Thus, a semiconductor device having desired illuminance dependency in accordance with on a purpose can be obtained.

Figure 6:
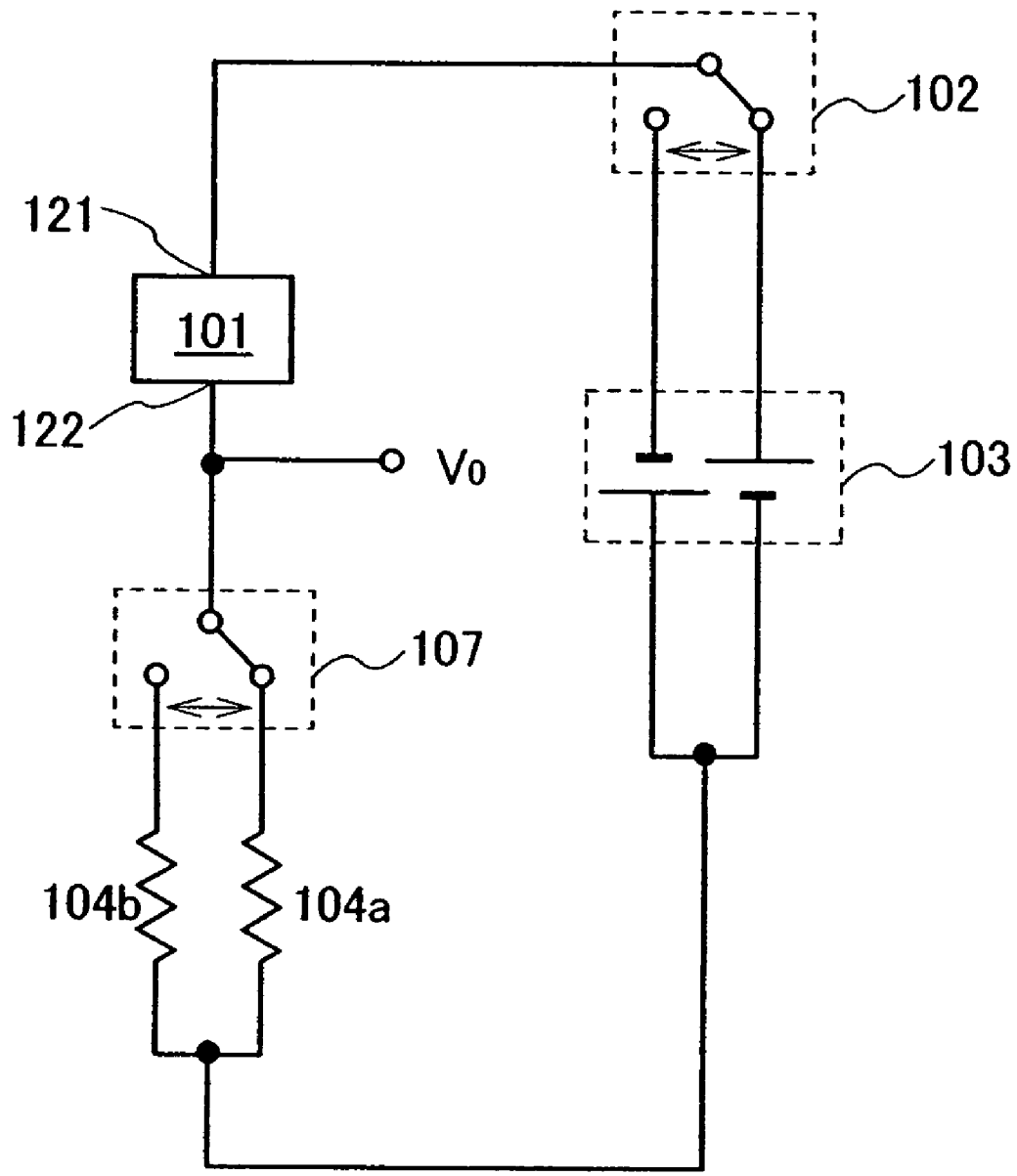
FIG. 6 is a diagram showing a semiconductor device of the invention.

Further, a difference between an output current in the range A and that in the range B may be the same ranges of output voltages by selection of a resistance value of a resistor connected to the photoelectric conversion device 101, that is, the resistor 104 in accordance with the power source 103 in FIG. 1A. In specific, as shown in FIG. 6, a resistor 104a and the resistor 104b are switched with use of the switching unit 107 that can conduct switching at the same time as the bias switching unit 102, and a current flowing through the photoelectric conversion device 101 may be outputted as a voltage from the terminal $V_O$.

Note that in the above description, for detection of illuminance, characteristics of the photoelectric conversion element 115 is used in the range A at a predetermined level of illuminance, and the open-circuit voltage Voc obtained from photoelectric conversion element 115 and characteristics of the thin film transistor 112 are used in the range B at a predetermined level of illuminance. Instead, characteristics to be used may be interchanged at a predetermined level of illuminance. For example, in FIG. 4, in the range A, a current amplification factor of the current mirror circuit 114 is reduced, whereby the output current |I| obtained from the photoelectric conversion device 101 may be reduced to 11, whereas in the range B, a threshold of the thin film transistor 113 is controlled, whereby the output current |I| may be increased to 10 in FIG. 4. When a relation of an output current in the range A and an output current in the range B is thus opposite, in detecting illuminance, the open-circuit voltage Voc obtained from the photoelectric conversion element 115 and characteristics of the thin film transistor 112 may be used in the range A, and characteristics of the photoelectric conversion element 115 may be used in the range B.

Figure 7:
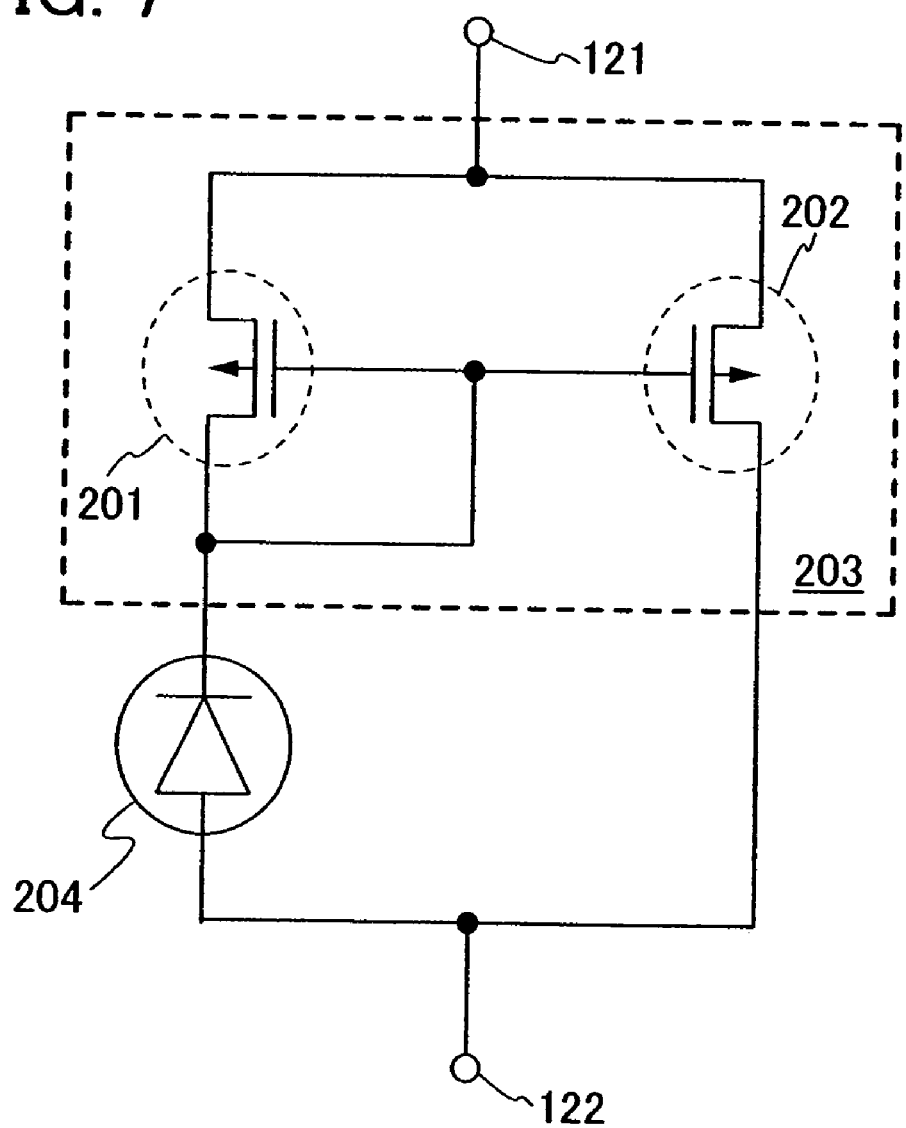
FIG. 7 is a diagram showing a photoelectric conversion device of the invention.

Note that in this embodiment mode, an n-channel thin film transistor is used for each thin film transistor included in the current mirror circuit 114. Alternatively, p-channel transistor may be used. FIG. 7 shows an example of an equivalent circuit diagram of the photoelectric conversion device in a case of using a p-channel thin film transistor for the current mirror circuit. In FIG. 7, a current mirror circuit 203 has a thin film transistor 201 and a thin film transistor 202. The terminal 121 is connected to the terminal 122 through the thin film transistor 201 and a photoelectric conversion element 204. Also, the terminal 121 is connected to the terminal 122 through the thin film transistor 202. Note that a gate electrode of the thin film transistor 202 is connected to a gate electrode of the thin film transistor 201 and a wiring connecting the thin film transistor 201 and the photoelectric conversion element 204. Note that a plurality of units each including the thin film transistor 202 may be provided in parallel, similarly to FIG. 1B.

Thus, by the invention, by reversal of a bias to be applied to the photoelectric conversion device, a wider range of illuminance can be detected without expansion of a range of an output voltage or output current. Further, characteristics of the thin film transistor included in the photoelectric conversion device, such as a threshold value or an S value, is changed, whereby a range of detectable illuminance, an output current, an output voltage, and the like can be changed in accordance with a purpose.

Figure 1B:
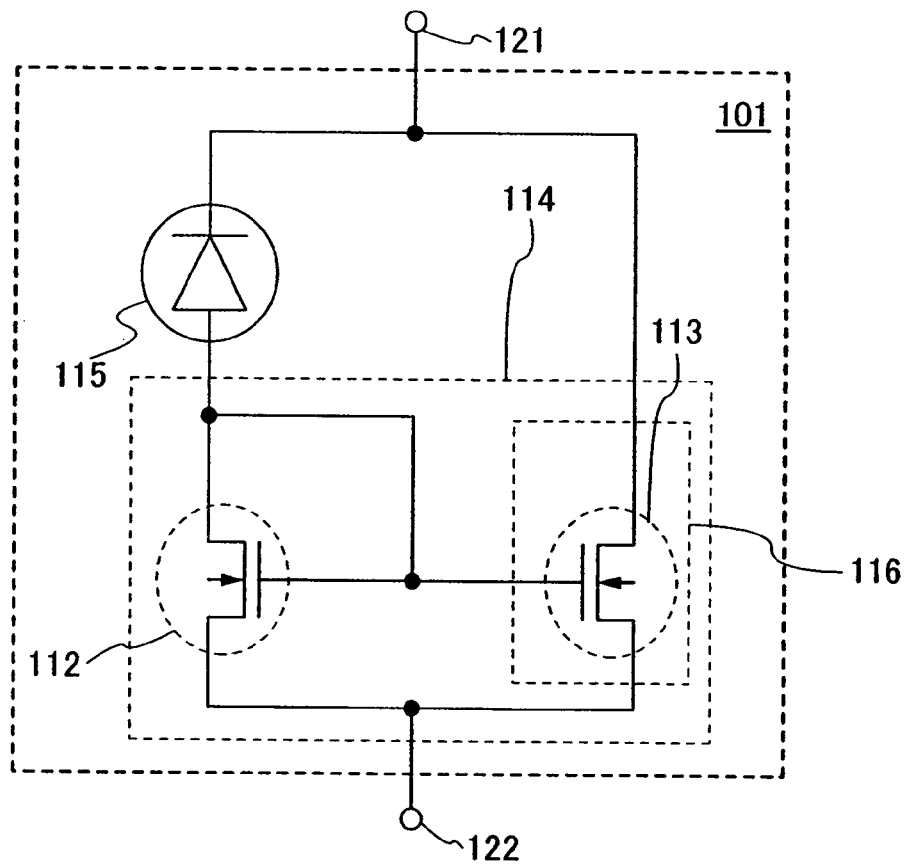
Figure 2:
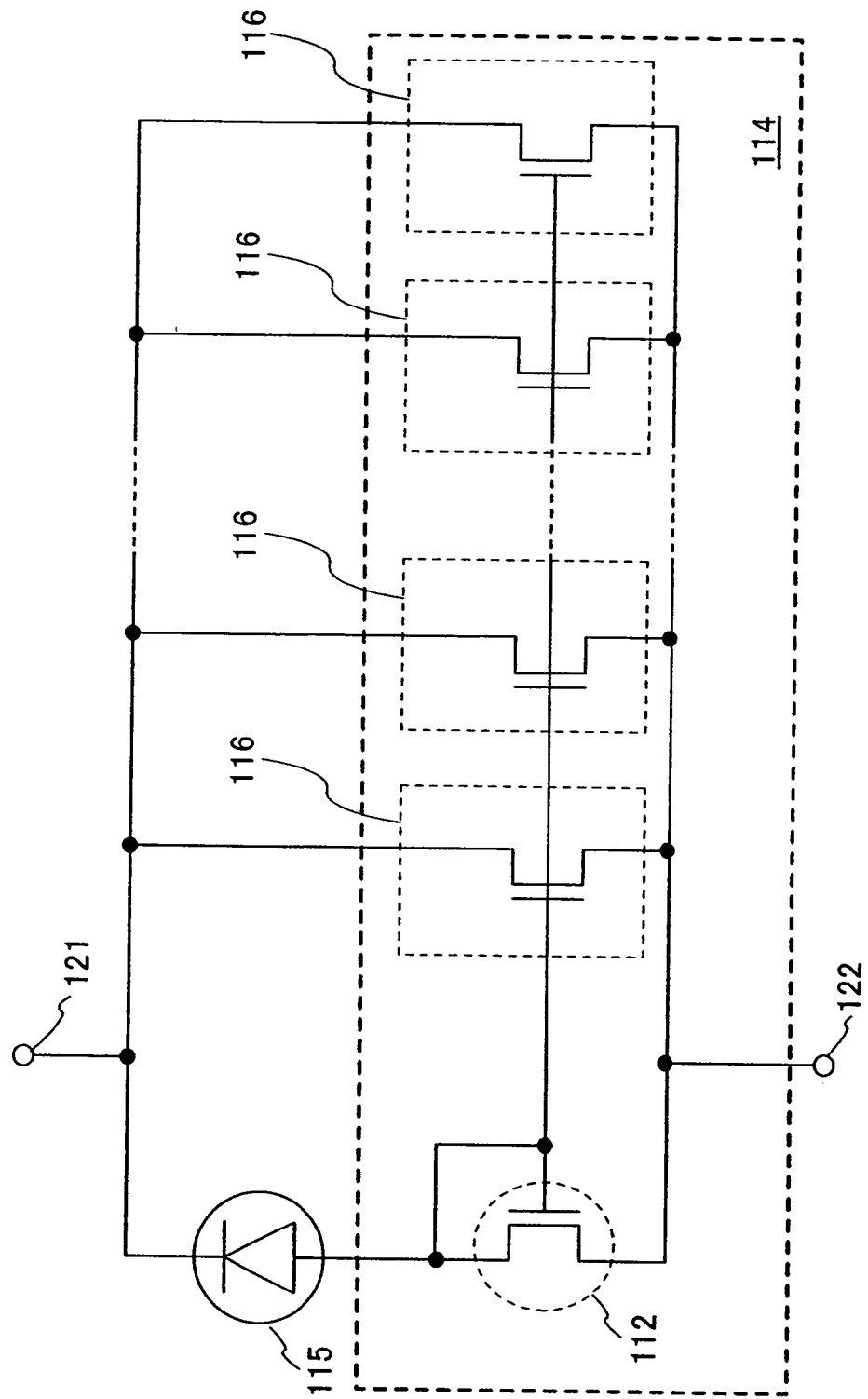
FIG. 2 is a diagram showing a photoelectric conversion device of the invention.
Figure 8A:
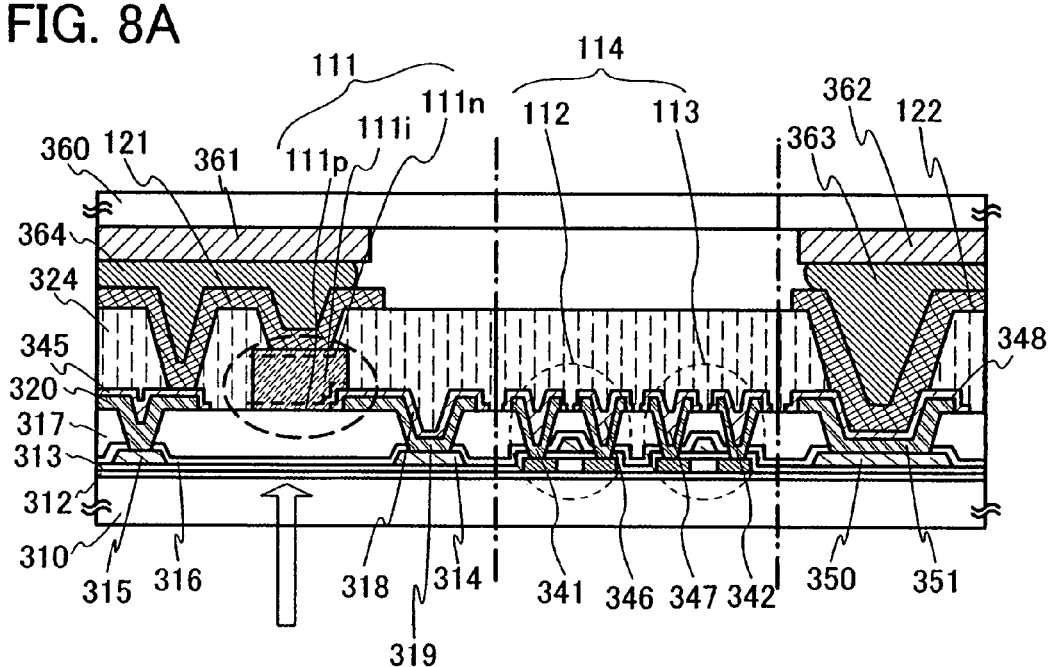
FIGS. 8A and 8B are cross sectional views each showing a photoelectric conversion device of the invention.
Figure 8B:
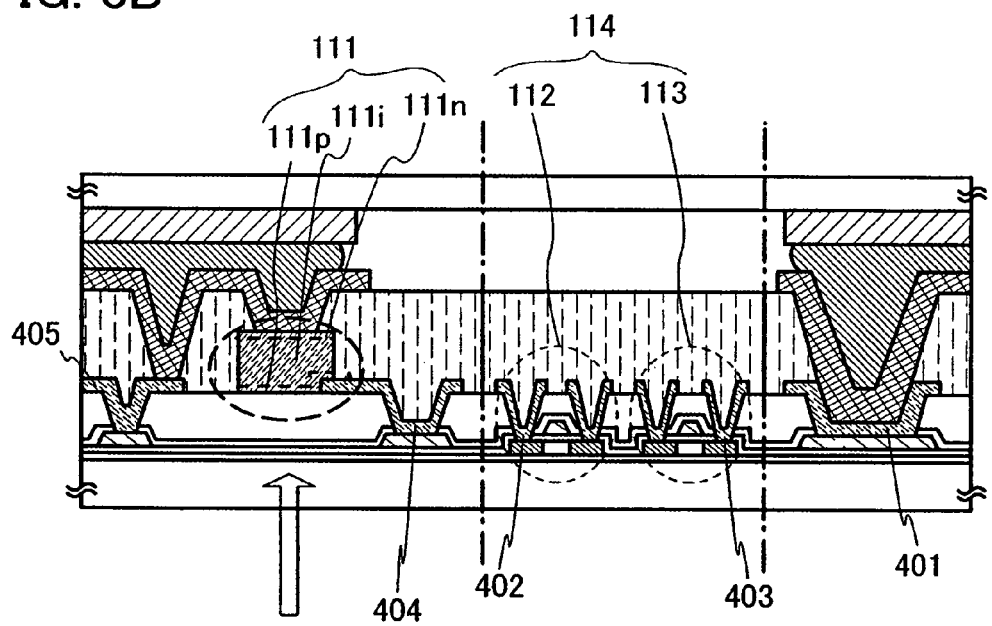

FIGS. 8A and 8B show cross sectional views of structure examples of the photoelectric conversion device 101 shown in FIG. 1B.

In FIG. 8A, a reference numeral 310 refers to a substrate, 312 refers to a base insulating film, and 313 refers to a gate insulating film. Since light to be detected passes through the substrate 310, the base insulating film 312, and the gate insulating film 313, materials having a high light transmitting property are desirably used as materials of all of them.

The photoelectric conversion element 115 in FIG. 1B has a wiring 319, a protective electrode 318, a photoelectric conversion layer 111, and the terminal 121. Note that the photoelectric conversion layer 111 has a p-type semiconductor layer 111$p$, an n-type semiconductor layer 111$n$, and an intrinsic (i-type) semiconductor layer 111$i$ provided between the p-type semiconductor layer 111$p$ and the n-type semiconductor layer 111$n$. The photoelectric conversion element is not limited to this, and it is only necessary to have a first conductive layer, a second conductive layer, and a photoelectric conversion layer interposed between these two conductive layers. Note that also, the photoelectric conversion layer is not limited to the above, and it may have at least a stacked structure of a p-type semiconductor layer and an n-type semiconductor layer.

First, the p-type semiconductor layer 111$p$ may be formed by deposition of a semi-amorphous silicon film containing an impurity element belonging to Group 13, for example, boron (B) by a plasma CVD method. Alternatively, after formation of a semi-amorphous silicon film, an impurity element belonging to Group 13 may be introduced.

Note that a semi-amorphous semiconductor film includes a semiconductor which has an intermediate structure between an amorphous semiconductor and a semiconductor having a crystalline structure (including a single crystal and a polycrystal). The semi-amorphous semiconductor film has a third condition which is stable in terms of free energy, and is a crystalline substance having a short-range order and lattice distortion, and the semi-amorphous semiconductor film having the crystal grain size of 0.5 to 20 nm can be dispersed in a non-single crystalline semiconductor film. As for the semi-amorphous semiconductor film, Raman spectrum thereof is shifted to a wavenumber side lower than 520 cm$^{-1}$, and the diffraction peaks of (111) and (220) that are said to be caused by a Si crystal lattice are observed in X-ray diffraction. In addition, the semi-amorphous semiconductor film contains hydrogen or halogen of at least 1 atomic % or more to terminate a dangling bond. In the present specification, such a semiconductor film is referred to as a semi-amorphous semiconductor (SAS) film for the sake of convenience. Moreover, a noble gas element such as helium, argon, krypton or neon is contained to further promote lattice distortion so that stability is enhanced and a favorable semi-amorphous semiconductor film can also be obtained. Note that a microcrystalline semiconductor film (microcrystal semiconductor film) is also included in the semi-amorphous semiconductor film.

Also, the SAS film can be obtained by glow discharge decomposition of gas containing silicon. As typical gas containing silicon, $SiH_4$ is given, and $Si_2H_6$, $SiH_2Cl_2$, $SiHCl_3$, $SiCl_4$, $SiF_4$ or the like may be used instead. The gas containing silicon is diluted with hydrogen, or gas in which one or more of noble gas elements of helium, argon, krypton and neon are added to hydrogen; whereby, the SAS film can be formed easily. It is preferable that the dilution ratio be set to be in a range of 2 to 1000 times. Moreover, carbide gas such as $CH_4$ or $C_2H_6$, germanium gas such as $GeH_4$ or $GeF_4$, $F_2$ or the like may be mixed in the gas containing silicon to adjust an energy band width to be 1.5 to 2.4 eV or 0.9 to 1.1 eV.

After the p-type semiconductor layer 111$p$ is formed, a semiconductor layer which does not contain an impurity imparting a conductivity type (referred to as an intrinsic semiconductor layer or an i-type semiconductor layer) 111$i$ and the n-type semiconductor layer 111$n$ are sequentially formed. Accordingly, the photoelectric conversion layer 111 including the p-type semiconductor layer 111$p$, the i-type semiconductor layer 111$i$ and the n-type semiconductor layer 111$n$ is formed.

Note that, in this specification, the i-type semiconductor layer refers to a semiconductor layer in which the concentration of an impurity imparting p-type or n-type conductivity is $1 \times 10^{20}$ cm$^{-3}$ or less, and the concentration of oxygen and nitrogen is $5 \times 10^{19}$ cm$^{-3}$ or less. Note that photoconductivity is preferably 1000 times or more dark conductivity. In addition, 10 to 1000 ppm of boron (B) may be added to the i-type semiconductor layer.

As the i-type semiconductor layer 111$i$, for example, a semi-amorphous silicon film may be formed by a plasma CVD method. In addition, as the n-type semiconductor layer 111$n$, a semi-amorphous silicon film containing an impurity element belonging to Group 15, for example, phosphorous (P) may be formed, and alternatively, an impurity element belonging to Group 15 may be introduced after the semi-amorphous silicon film is formed.

As the p-type semiconductor layer 111$p$, the intrinsic semiconductor layer 111$i$ and the n-type semiconductor layer 111$n$, an amorphous semiconductor film may be used instead of a semi-amorphous semiconductor film.

Each of the wiring 319, a connection electrode 320, a terminal electrode 351, a source electrode and a drain electrode 341 of the thin film transistor 112 and a source electrode and a drain electrode 342 of the thin film transistor 113 has a stacked layer structure of a refractory metal film and a low resistance metal film (such as an aluminum alloy or pure aluminum). Here, the wiring and these electrodes each have a three-layer structure in which a titanium film (Ti film), an aluminum film (Al film) and a Ti film are sequentially stacked.

Moreover, protective electrodes 318, 345, 348, 346 and 347 are formed so as to cover the wiring 319, the connection electrode 320, the terminal electrode 351, the source electrode and the drain electrode 341 of the thin film transistor 112 and the source electrode and the drain electrode 342 of the thin film transistor 113, respectively.

The protective electrodes protect the wiring 319 and the like in an etching step for forming the photoelectric conversion layer 111. As a material for the protective electrode 318, a conductive material having slower etching speed than that of the photoelectric conversion layer to an etching gas (or an etchant) for the photoelectric conversion layer 111 is preferable. In addition, a conductive material which does not react with the photoelectric conversion layer 111 to become an alloy is preferable as the material for the protective electrode 318. Note that the other protective electrodes 345, 348, 346 and 347 are also formed by the similar material and manufacturing process to the protective electrode 318.

Alternatively, a structure in which the protective electrodes 318, 345, 348, 346 and 347 are not formed may be employed. FIG. 8B shows an example in which these protective electrodes are not formed. In FIG. 8B, each of a wiring 404, a connection electrode 405, a terminal electrode 401, a source electrode and a drain electrode 402 of a thin film transistor 112, and a source electrode and a drain electrode 403 of a thin film transistor 113 is formed from a single-layer conductive film, and as such a conductive film, a titanium film (Ti film) is preferable. Instead of the titanium film, a single-layer film formed from an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir) and platinum (Pt); an alloy material or a compound material containing the above element as its main component; a single-layer film formed from nitride of these elements, for example, titanium nitride, tungsten nitride, tantalum nitride, or molybdenum nitride; or a stacked-layer film of them can be used. The number of times of deposition can be reduced in a manufacturing process by formation of the wiring 404, the connection electrode 405, the terminal electrode 401, the source electrode and the drain electrode 402 of the thin film transistor 112, and the source electrode and the drain electrode 403 of the thin film transistor 113 as a single-layer film. It is needless to say that the same material of the wiring 404 and the like can be used for the wiring 319, the connecting electrode 320, the terminal electrode 351, the source electrode and the drain electrode 341 of the thin film transistor 112, and the source electrode and the drain electrode 342 of the thin film transistor 113 that are shown in FIG. 8A.

FIGS. 8A and 8B each show an example of a top gate thin film transistor of a structure in which the n-channel thin film transistors 112 and 113 each include one channel formation region (in this specification, referred to as a single gate structure). Alternatively, a structure having a plurality of channel formation regions may be used to reduce variation in the ON current value. In order to reduce the OFF current value, lightly doped drain (LDD) regions may be provided in the n-channel thin film transistors 112 and 113. The LDD region is a region to which an impurity element is added at low concentration between a channel formation region and a source region or a drain region which is formed by being added with an impurity element at high concentration. By providing the LDD regions, an effect that an electric field in the vicinity of the drain region is reduced and deterioration due to hot carrier injection is prevented can be obtained.

In addition, in order to prevent deterioration of the ON current value due to a hot carrier, the n-channel thin film transistors 112 and 113 may have a structure in which an LDD region and a gate electrode are placed so as to be overlapped with each other with a gate insulating film interposed therebetween (in this specification, referred to as a GOLD (Gate-drain Overlapped LDD) structure). In a case where a GOLD structure is used, the effect that an electric field in the vicinity of a drain region is reduced and deterioration due to hot carrier injection is prevented is more enhanced than in a case where an LDD region and a gate electrode are not overlapped with each other. With such a GOLD structure, electric field intensity in the vicinity of a drain region is reduced and hot carrier injection is prevented, and thus, it is effective for prevention of deterioration phenomenon.

The thin film transistors 112 and 113 included in the current mirror circuit 114 may be a bottom gate thin film transistor, for example, an inversely staggered thin film transistor, instead of the top gate thin film transistor described above.

In addition, a wiring 314 is connected to the wiring 319, and also becomes a gate electrode by being extended to an upper side of the channel formation region of the thin film transistor 113 of the amplifier circuit.

A wiring 315 is connected to the terminal 121 connected to the n-type semiconductor layer 111n through the connection wiring 320 and the protective electrode 345, and is connected to a drain wiring (also referred to as a drain electrode) or a source wiring (also referred to as a source electrode) of the thin film transistor 113.

Since light to be detected passes through interlayer insulating films 316 and 317, a material having a high light transmitting property is preferably used as the materials for both of them. Note that for the insulating film 317, an inorganic material such as a silicon oxide (SiOx) film is preferably used so that fixing intensity is improved. Also for a sealing layer 324, an inorganic material is preferably used, and the insulating films can be formed by a CVD method or the like.

In addition, a terminal electrode 350 is formed by the same process as the wirings 314 and 315, and the terminal electrode 351 is formed by the same process as the wiring 319 and the connection electrode 320. Note that the terminal 122 is connected to the terminal electrode 350 through the auxiliary electrode 348 and the terminal electrode 351.

Note that the terminal 121 is mounted on an electrode 361 of a substrate 360 by a solder 364. The terminal 122 is formed through the same process as the terminal electrode 121, and is mounted on an electrode 362 of the substrate 360 by a solder 363.

In FIGS. 8A and 8B, as shown by arrows in the drawings, light enters the photoelectric conversion layer 111 from the substrate 310 side. Accordingly, a current is generated, and the light can be sensed.

In such a photoelectric conversion device, a bias to be applied is reversed, so that a wide range of illuminance can be detected without an output voltage or an output current range being expanded. Further, a property of a thin film transistor included in the photoelectric conversion device, such as a threshold value or an S value, is changed, whereby a detection range of light, an output voltage or the like can be changed in accordance with a purpose.

Embodiment 1

In this embodiment, current characteristics obtained when a bias applied to the photoelectric conversion device is reversed is described with reference to FIGS. 9 to 11.

Figure 9:
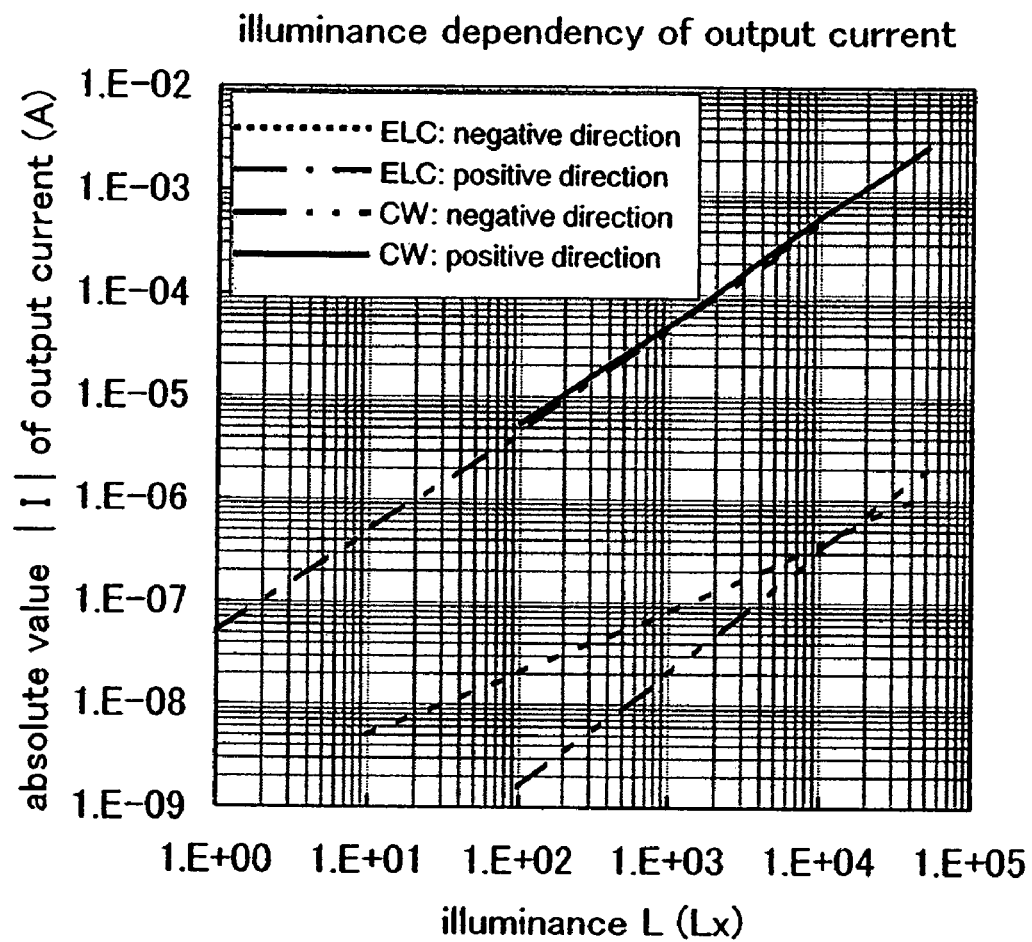
FIG. 9 is a diagram showing illuminance dependency with respect to an output current of a photoelectric conversion device of the invention.
Figure 10:
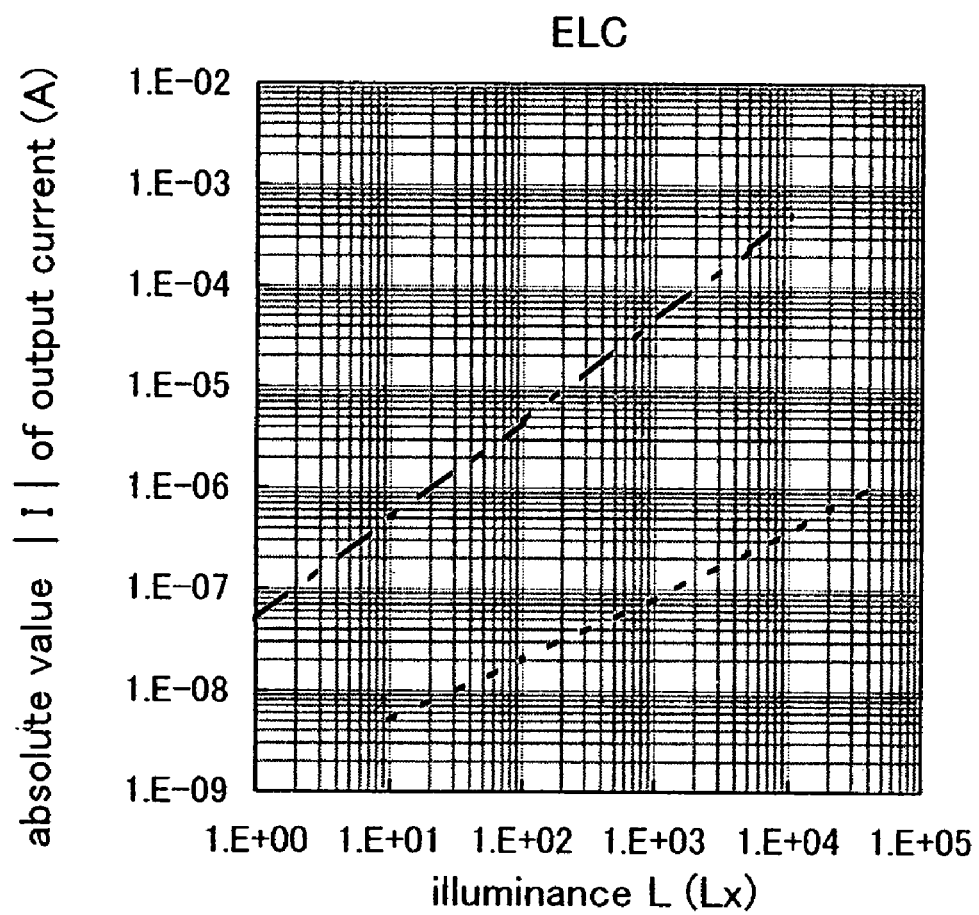
FIG. 10 is a diagram showing illuminance dependency with respect to an output current of a photoelectric conversion device of the invention.

FIGS. 9 and 10 show illuminance dependency of an output current obtained when a bias is applied to the photoelectric conversion device shown in FIG. 2. Note that in FIG. 2, the number of the units 116 is set to 100.

In FIG. 9, ELC denotes illuminance dependency of an output current obtained from a photoelectric conversion device having a current mirror circuit formed by a thin film transistor in which an island-shaped semiconductor region is crystallized by an excimer laser. Also, CW denotes illuminance dependency of an output current obtained from a photoelectric conversion device having a current mirror circuit formed by a thin film transistor in which an island-shaped semiconductor region is crystallized by a continuous wave laser. In addition, a positive direction and a negative direction denote directions of a bias to be applied to a photoelectric conversion device, and a state of FIG. 3A is a positive direction, whereas a state of FIG. 3B is a negative direction. Note that FIG. 10 shows illuminance dependency in the case of ELC.

According to FIG. 9, only when a bias of an opposite direction is applied, it is observed that there is a difference between an output current of a photoelectric conversion device using a thin film transistor having an island-shaped semiconductor region crystallized by an excimer laser and an output current of a photoelectric conversion device using a thin film transistor having an island-shaped semiconductor region crystallized by a continuous wave laser. This derives from crystallinity of the island-shaped semiconductor region in the thin film transistor. As described also in Embodiment Mode 1, for detection of illuminance, characteristics of a photoelectric conversion element are used when applying a bias of a positive direction, and an open-circuit voltage Voc obtained from a photoelectric conversion element and characteristics of the thin film transistor are used when applying a bias of a negative direction. Therefore, it is found that illuminance dependency of an output current obtained from a photoelectric conversion device can be changed depending on crystallinity of an island-shaped semiconductor region. Note that the illuminance dependency can also be changed depending on an S value of a thin film transistor or a threshold value of a thin film transistor, which is affected by crystallinity of an island-shaped semiconductor region. Accordingly, the photoelectric conversion device can have desired illuminance dependency. Thus, a semiconductor device can be obtained, which has a light detecting function in accordance with a purpose and which can detect a wider range of illuminance by reversal of a bias to be applied to the photoelectric conversion device, without expansion of a range of an output voltage or output current.

In the case of ELC, when a predetermined intensity by which a bias to be applied to a photoelectric conversion device is set to be 100 lx and a range of an output current is set to be 20 nA to 5 μA, a lower limit of a range of detectable illuminance can be approximately 0.5 lx and an upper limit thereof can be 100,000 lx or more. Therefore, a wider range of illuminance can be detected without expansion of a range of an output current.

Figure 11:
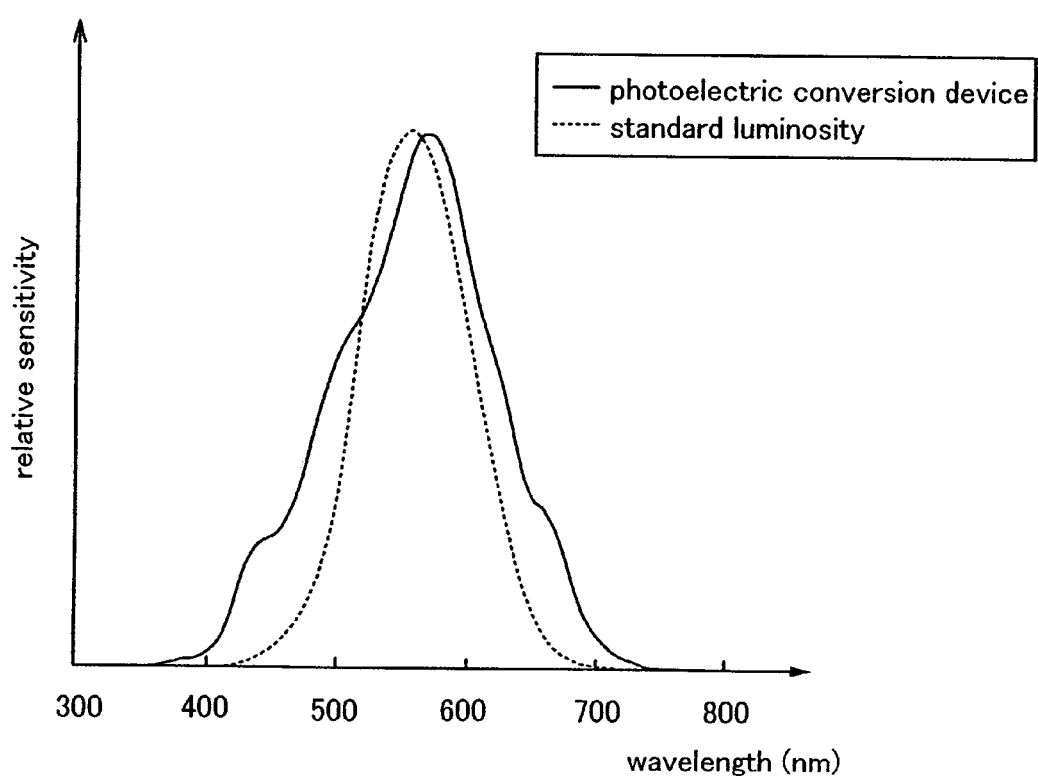
FIG. 11 is a diagram showing a relative sensitivity curve of a photoelectric conversion device of the invention and a standard relative luminosity curve.

Note that FIG. 11 shows a relative sensitivity curve of the photoelectric conversion device of the present invention and a standard luminosity curve. According to FIG. 11, it is found that the relative sensitivity of the photoelectric conversion device of the present invention is extremely close to the standard luminosity. Since luminosity close to human eyes can be obtained by the photoelectric conversion device of the present invention, the photoelectric conversion device can be higher-performance when used as an optical sensor.

Note that this embodiment can be implemented in appropriate combination with any of the embodiment mode and the other embodiments.

Embodiment 2

In this embodiment, description is made of a semiconductor device having a photoelectric conversion device to which the present invention is applied and a manufacturing method of the semiconductor device. Note that each of FIGS. 8A and 8B and FIGS. 12A to 14A show an example of a partial cross sectional view of a photoelectric conversion device, and description is made with reference to them.

First, an element is formed over a substrate (first substrate 310). In this embodiment, AN 100, which is one of glass substrates, is used as the substrate 310.

Subsequently, a silicon oxide film containing nitrogen (with a film thickness of 100 nm) to be the base insulating film 312 is formed by a plasma CVD method, and a semiconductor film such as an amorphous silicon film containing hydrogen (with a film thickness of 54 nm) is stacked without being exposed to an atmospheric air. Further, the base insulating film 312 may be formed by stacking a silicon oxide film, a silicon nitride film, and a silicon oxide film containing nitrogen. For example, a film in which a silicon nitride film containing oxygen with a film thickness of 50 nm and a silicon oxide film containing nitrogen with a film thickness of 100 nm are stacked may be formed as the base insulating film 312. It is to be noted that the silicon oxide film containing nitrogen and the silicon nitride film serve as a blocking layer that prevents an impurity such as an alkali metal from diffusing from the glass substrate.

Then, the amorphous silicon film is crystallized by a solid-phase growth method, a laser crystallization method, a crystallization method using a catalytic metal, or the like to form a semiconductor film having a crystalline structure (a crystalline semiconductor film), for example, a polycrystalline silicon film. Here, a polycrystalline silicon film is obtained by a crystallization method using a catalytic element. A nickel acetate solution containing nickel of 10 ppm by weight is applied by a spinner. It is to be noted that a nickel element may be dispersed over the entire surface by a sputtering method instead of application of the solution. Then, heat treatment is performed for crystallization to form a semiconductor film having a crystalline structure. Here, a polycrystalline silicon film is obtained by heat treatment for crystallization (at 550° C. for 4 hours) after the heat treatment (at 500° C. for one hour).

Next, an oxide film over the surface of the polycrystalline silicon film is removed by a dilute hydrofluoric acid or the like. Thereafter, in order to increase a crystallization rate in the polycrystalline silicon film and repair defects left in crystal grains, irradiation with laser light (XeCl: wavelength of 308 nm) is performed in the atmosphere or the oxygen atmosphere.

As the laser light, excimer laser light with a wavelength of 400 nm or less; or a second harmonic or a third harmonic of a YAG laser is used. Here, pulse laser light with a repetition frequency of approximately 10 to 1000 Hz is used, the pulse laser light is condensed to 100 to 500 mJ/cm$^2$ by an optical system, and irradiation is performed with an overlap rate of 90 to 95%, whereby a surface of the silicon film may be scanned. In this embodiment, irradiation with laser light having a repetition frequency of 30 Hz and energy density of 470 mJ/cm$^2$ is performed in the atmosphere.

Note that since laser light irradiation is performed in an atmospheric air or in an oxygen atmosphere, an oxide film is formed on the surface by the laser light irradiation. Note that an example in which the pulse laser is used is shown in this embodiment. Instead, a continuous wave laser may be used. In order to obtain crystal with large grain size at the time of crystallization of a semiconductor film, it is preferable to use a solid laser which is capable of continuous oscillation and to apply the second to fourth harmonic of a fundamental wave. Typically, a second harmonic (532 nm) or a third harmonic (355 nm) of an Nd:YVO$_4$ laser (a fundamental wave of 1064 nm) may be applied.

In a case of using a continuous wave laser, laser light which is emitted from a continuous wave YVO$_4$ laser of 10 W output is converted into a harmonic by a non-linear optical element. Also, there is a method by which YVO$_4$ crystal and a non-linear optical element are put in an oscillator and a high harmonic is emitted. Then, the laser light having a rectangular shape or an elliptical shape on an irradiated surface is preferably formed by an optical system to be emitted to an object to be processed. At this time, an energy density of approximately 0.01 to 100 MW/cm$^2$ (preferably, 0.1 to 10 MW/cm$^2$)

is necessary. The semiconductor film may be moved at approximately a rate of 10 to 2000 cm/s relatively with respect to the laser light so as to be irradiated.

Subsequently, in addition to the oxide film which is formed by the above laser light irradiation, a barrier layer formed of an oxide film having a thickness of 1 to 5 nm in total is formed by treatment of the surface with ozone water for 120 seconds. The barrier layer is formed in order to remove the catalytic element which is added for crystallization, for example, nickel (Ni) from the film. Although the barrier layer is formed using ozone water here, the barrier layer may be formed by deposition of an oxide film having a thickness of approximately 1 to 10 nm by a method of oxidizing a surface of the semiconductor film having a crystalline structure by UV-ray irradiation in an oxygen atmosphere; a method of oxidizing a surface of the semiconductor film having a crystalline structure by oxygen plasma treatment; a plasma CVD method; a sputtering method; an evaporation method; or the like. Alternatively, the oxide film formed by the laser light irradiation may be removed before formation of the barrier layer.

Then, an amorphous silicon film containing an argon element which serves as a gettering site is formed to be 10 to 400 nm thick, here 100 nm thick, over the barrier layer by a sputtering method. The amorphous silicon film containing an argon element is formed under an atmosphere containing argon with the use of a silicon target. In a case where an amorphous silicon film containing an argon element is formed by a plasma CVD method, deposition conditions are as follows: flow ratio of monosilane to argon ($SiH_4$: Ar) is 1:99, deposition pressure is set to be 6.665 Pa, RF power density is set to be 0.087 W/cm$^2$, and deposition temperature is set to be 350° C.

Thereafter, heat treatment in a furnace heated at 650° C. is performed for 3 minutes to remove a catalytic element (gettering). Accordingly, the catalytic element concentration in the semiconductor film having a crystalline structure is reduced. A lamp annealing apparatus may be used instead of the furnace.

Subsequently, the amorphous silicon film containing an argon element, which is a gettering site, is selectively removed using the barrier layer as an etching stopper, and thereafter, the barrier layer is selectively removed with a diluted hydrofluoric acid. Note that nickel has a tendency to move to a region having high oxygen concentration at the time of gettering; therefore, it is preferable that the barrier layer formed of an oxide film be removed after gettering.

Note that, in a case where crystallization with the use of a catalytic element is not performed to a semiconductor film, the above steps such as forming the barrier layer, forming the gettering site, heat treatment for gettering, removing the gettering site, and removing the barrier layer are not required.

Figure 12A:
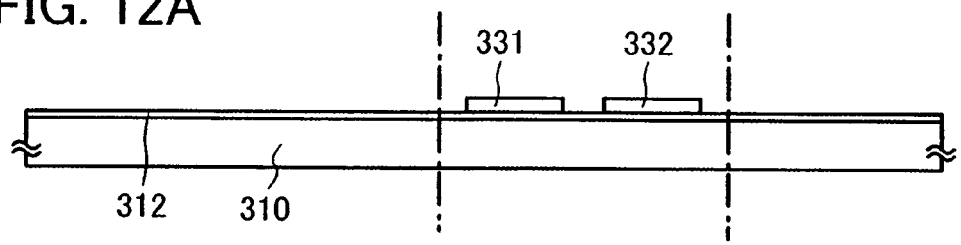
FIGS. 12A to 12D are views showing a manufacturing process of a semiconductor device of the invention.

Subsequently, a thin oxide film is formed on the surface of the obtained semiconductor film having a crystalline structure (for example, a crystalline silicon film) with ozone water, and thereafter, a mask formed from a resist is formed using a first photomask and etching treatment into a desired shape is performed to form semiconductor regions that are separated into an island shape (in this specification, referred to as island-shaped semiconductor regions) 331 and 332 (see FIG. 12A). After the island-shaped semiconductor region is formed, the mask formed from a resist is removed.

Next, a very small amount of an impurity element (boron or phosphorus) is added in order to control a threshold value of a thin film transistor, if necessary. Here, an ion doping method is used, in which diborane ($B_2H_6$) is not separated by mass but excited by plasma.

Subsequently, the oxide film is removed with an etchant containing a hydrofluoric acid, and at the same time, the surfaces of the island-shaped semiconductor regions 331 and 332 are washed. Thereafter, an insulating film containing silicon as its main component, which becomes a gate insulating film 313, is formed. Here, a silicon oxide film containing nitrogen (composition ratio: Si=32%, O=59%, N=7%, and H=2%) is formed to have a thickness of 115 nm by a plasma CVD method.

Figure 12B:
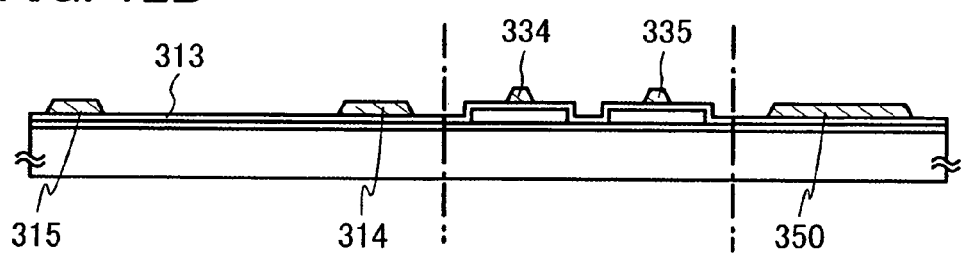

Subsequently, after a metal film is formed over the gate insulating film 313, patterning is performed using a second photomask to form gate electrodes 334 and 335, wirings 314 and 315, and a terminal electrode 350 (see FIG. 12B). As the metal film, for example, a film is used, in which tantalum nitride (TaN) and tungsten (W) are stacked to be 30 nm and 370 nm respectively.

As the gate electrodes 334 and 335, the wirings 314 and 315, and the terminal electrode 350, instead of the above film, a single-layer film formed from an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), and copper (Cu), or an alloy material or a compound material containing the above element as its main component; a single-layer film formed from nitride thereof, for example, titanium nitride, tungsten nitride, tantalum nitride or molybdenum nitride; or a stacked-layer film of them may be used.

Figure 12C:
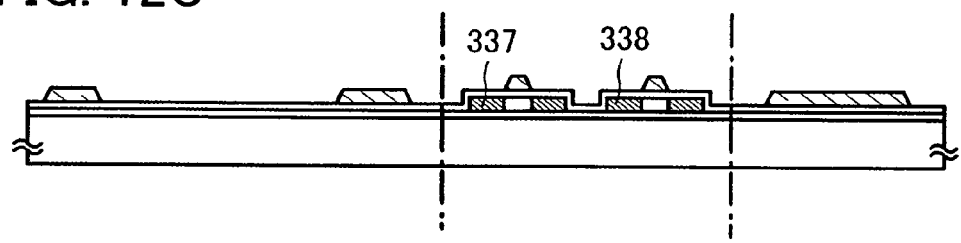

Subsequently, an impurity imparting one conductivity type is introduced to the island-shaped semiconductor regions 331 and 332 to form a source region and a drain region 337 of the thin film transistor 112 and a source region and a drain region 338 of the thin film transistor 113 (see FIG. 12C). In this embodiment, an n-channel thin film transistor is formed; therefore, an n-type impurity, for example, phosphorus (P) or arsenic (As) is introduced to the island-shaped semiconductor regions 331 and 332.

Next, a first interlayer insulating film (not shown) including a silicon oxide film is formed to be 50 nm thick by a CVD method, and thereafter, a step is performed, in which the impurity element added to each of the island-shaped semiconductor regions is activated. This activation process is performed by a rapid thermal annealing method (RTA method) using a lamp light source; an irradiation method with a YAG laser or an excimer laser from the back side; heat treatment using a furnace; or a method which is a combination of any of the foregoing methods.

Then, a second interlayer insulating film 316 including a silicon nitride film containing hydrogen and oxygen is formed, for example, to be 10 nm thick.

Figure 12D:
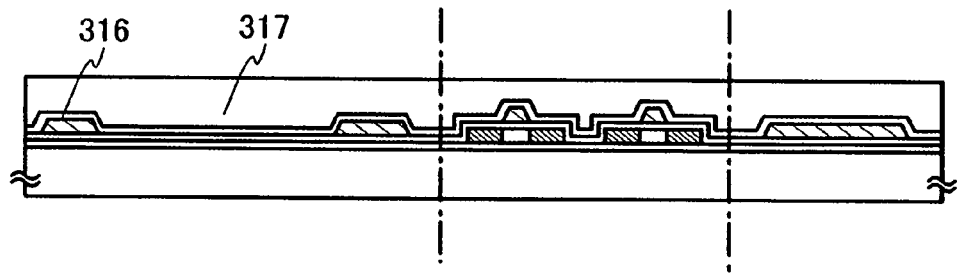

Subsequently, a third interlayer insulating film 317 formed of an insulating material is formed over the second interlayer insulating film 316 (see FIG. 12D). An insulating film obtained by a CVD method can be used for the third interlayer insulating film 317. In this embodiment, in order to improve fixing intensity, a silicon oxide film containing nitrogen is formed to be 900 nm thick as the third interlayer insulating film 317.

Then, heat treatment (heat treatment at 300 to 550° C. for 1 to 12 hours, for example, at 410° C. for 1 hour in a nitrogen atmosphere) is performed to hydrogenate the island-shaped semiconductor regions. This step is performed to terminate a dangling bond of the island-shaped semiconductor regions by hydrogen contained in the second interlayer insulating film 316. The island-shaped semiconductor regions can be hydrogenated regardless of whether or not the gate insulating film 313 is formed.

Alternatively, as the third interlayer insulating film 317, an insulating film using siloxane and a stacked structure thereof may be used. Siloxane is composed of a skeleton structure of a bond of silicon (Si) and oxygen (O). An organic group containing at least hydrogen (such as an alkyl group or an aryl group) is used as a substituent. Instead, a fluoro group may be used as a substituent.

In a case where an insulating film using siloxane and a stacked structure thereof are used as the third interlayer insulating film 317, after formation of the second interlayer insulating film 316, heat treatment to hydrogenate the island-shaped semiconductor regions can be performed, and then, the third interlayer insulating film 317 can be formed.

Subsequently, a mask formed from a resist is formed using a third photomask, and the first interlayer insulating film, the second interlayer insulating film 316, the third interlayer insulating film 317 and the gate insulating film 313 are selectively etched to form a contact hole. Then, the mask formed from a resist is removed.

Note that the third interlayer insulating film 317 may be formed if necessary. In a case where the third interlayer insulating film 317 is not formed, the first interlayer insulating film, the second interlayer insulating film 316, and the gate insulating film 313 are selectively etched after formation of the second interlayer insulating film 316 to form a contact hole.

Next, after formation of a metal stacked film by a sputtering method, a mask formed from a resist is formed using a fourth photomask, and then, the metal film is selectively etched to form the wiring 319, the connection electrode 320, the terminal electrode 351, the source electrode and the drain electrode 341 of the thin film transistor 112, and the source electrode and the drain electrode 342 of the thin film transistor 113. Then, the mask formed from a resist is removed. Note that the metal film of this embodiment is a stacked-layer film of a Ti film with a thickness of 100 nm, an Al film containing a very small amount of Si with a thickness of 350 nm, and a Ti film with a thickness of 100 nm.

In addition, as shown in FIG. 4B, in a case where each of the wiring 404, the connection electrode 405, the terminal electrode 401, the source electrode and the drain electrode 402 of the thin film transistor 112, and the source electrode and the drain electrode 403 of the thin film transistor 113 is formed of a single-layer conductive film, a titanium film (Ti film) is preferable in terms of heat resistance, conductivity, and the like. Instead of a titanium film, a single-layer film formed from an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir) and platinum (Pt), or an alloy material or a compound material containing the above element as its main component; a single-layer film formed from nitride thereof, for example, titanium nitride, tungsten nitride, tantalum nitride, or molybdenum nitride; or a stacked-layer film of them may be used. The number of times of deposition can be reduced in the manufacturing process, by formation of each of the wiring 404, the connection electrode 405, the terminal electrode 401, the source electrode and the drain electrode 402 of the thin film transistor 112, and the source electrode and the drain electrode 403 of the thin film transistor 113 as a single-layer film.

The top gate thin film transistors 112 and 113 using a polycrystalline silicon film can be manufactured through the process described above. Note that S values of the thin film transistors 112 and 113 can be changed depending on crystallinity of a semiconductor film and an interfacial state between a semiconductor film and a gate insulating film.

Figure 13A:
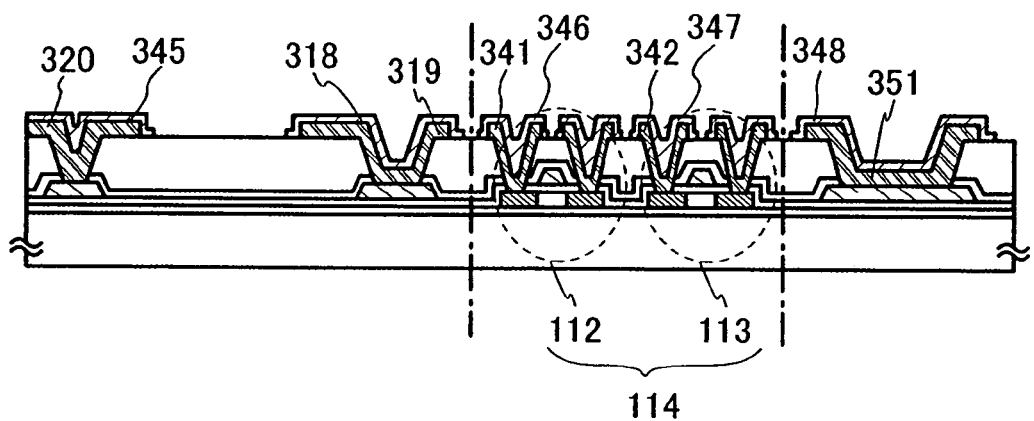
FIGS. 13A to 13C are views showing a manufacturing process of a semiconductor device of the invention.

Subsequently, after formation of a conductive metal film (such as titanium (Ti) or molybdenum (Mo)) which is not likely to be an alloy by reacting with a photoelectric conversion layer (typically, amorphous silicon) which is formed later, a mask formed from a resist is formed using a fifth photomask, and then, the conductive metal film is selectively etched to form a protective electrode 318 which covers the wiring 319 (see FIG. 13A). Here, a Ti film having a thickness of 200 nm obtained by a sputtering method is used. Note that the connection electrode 320, the terminal electrode 351, and the source electrode and the drain electrode of the thin film transistor are covered with a conductive metal film similar to the protective electrode 318. The conductive metal film also covers a side face where the second Al film is exposed in these electrodes; therefore, the conductive metal film also can prevent diffusion of an aluminum atom to the photoelectric conversion layer.

Note that in a case where the wiring 319, the connection electrode 320, the terminal electrode 351, the source electrode and the drain electrode 341 of the thin film transistor 112, and the source electrode and the drain electrode 342 of the thin film transistor 113 are formed as a single-layer conductive film, that is, as shown in FIG. 8B, in a case where the wiring 404, the connection electrode 405, the terminal electrode 401, the source electrode and the drain electrode 402 of the thin film transistor 112, and the source electrode and the drain electrode 403 of the thin film transistor 113 are formed instead of these electrodes or wiring, the protective electrode 318 is not necessarily formed.

Subsequently, a photoelectric conversion layer 111 including a p-type semiconductor layer 111p, an i-type semiconductor layer 111i and an n-type semiconductor layer 111n is formed over the third interlayer insulating film 317.

The p-type semiconductor layer 111p may be formed by deposition of a semi-amorphous silicon film containing an impurity element belonging to Group 13 such as boron (B) by a plasma CVD method, or may be formed by introduction of an impurity element belonging to Group 15 after formation of semi-amorphous silicon film.

Note that the wiring 319 and the protective electrode 318 are in contact with the bottom layer of the photoelectric conversion layer 111, in this embodiment, the p-type semiconductor layer 111p.

After the p-type semiconductor layer 111p is formed, the i-type semiconductor layer 111i and the n-type semiconductor layer 111n are sequentially formed. Accordingly, the photoelectric conversion layer 111 including the p-type semiconductor layer 111p, the i-type semiconductor layer 111i and the n-type semiconductor layer 111n is formed.

As the i-type semiconductor layer 111i, for example, a semi-amorphous silicon film may be formed by a plasma CVD method. In addition, as the n-type semiconductor layer 111n, a semi-amorphous silicon film containing an impurity element belonging to Group 15, for example, phosphorus (P) may be formed, or after formation of a semi-amorphous silicon film, an impurity element belonging to Group 15 may be introduced.

Alternatively, as the p-type semiconductor layer 111p, the intrinsic semiconductor layer 111i and the n-type semiconductor layer 111n, an amorphous semiconductor film may be used instead of a semi-amorphous semiconductor film.

Figure 13B:
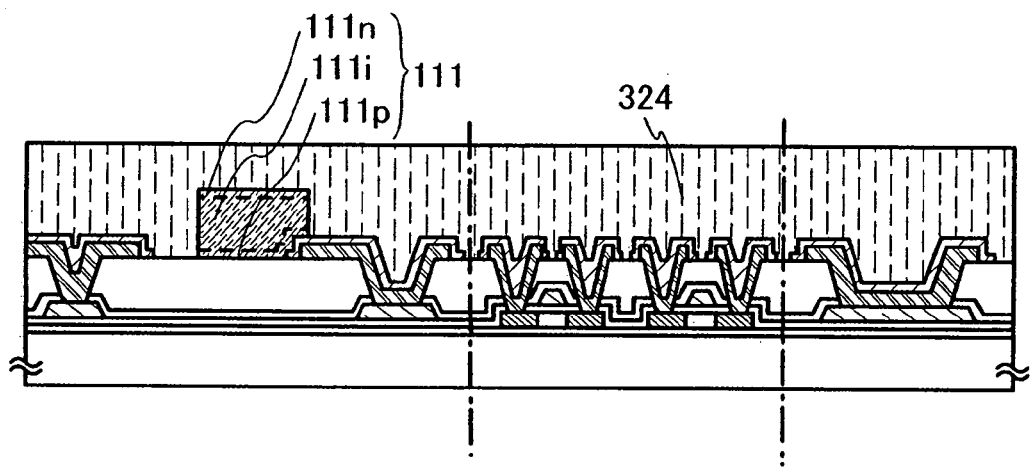

Next, a sealing layer 324 formed from an insulating material (for example, an inorganic insulating film containing silicon) is formed to have a thickness of 1 to 30 μm over the entire surface to obtain a state shown in FIG. 13B. Here, as an insulating material film, a silicon oxide film containing nitrogen with a thickness of 1 g/m is formed by a CVD method. An inorganic insulating film is used, whereby improvement in adhesiveness is achieved.

Subsequently, after the sealing layer 324 is etched to provide an opening, terminals 121 and 122 are formed by a sputtering method. Each of the terminals 121 and 122 is a stacked-layer film of a titanium film (Ti film) (100 nm), a nickel film (Ni film) (300 nm), and a gold film (Au film) (50 nm). The thus obtained terminal 121 and terminal 122 have a fixing intensity of higher than 5 N, which is sufficient fixing intensity as a terminal electrode.

Figure 13C:
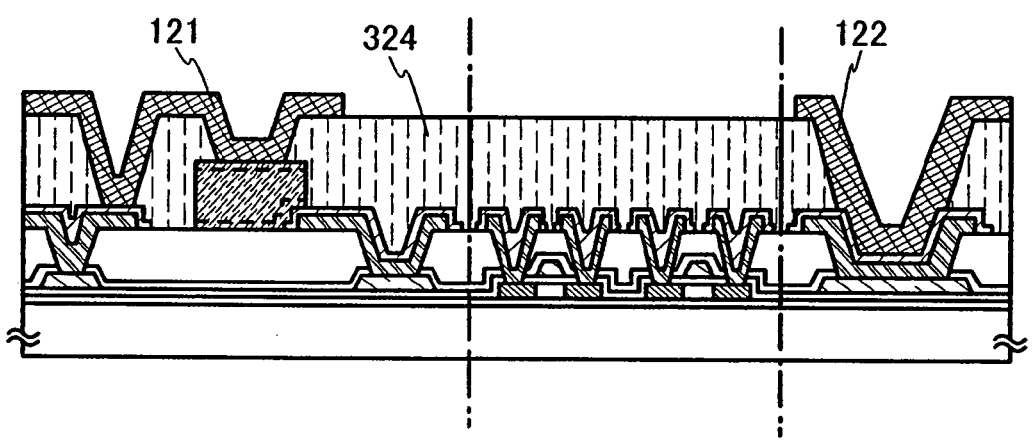

Through the process described above, the terminal 121 and the terminal 122 which can be connected by a solder are formed, and a structure shown in FIG. 13C can be obtained.

Thus, a large quantity of photo IC chips (2 mm×1.5 mm each), that is, photoelectric conversion device chips can be manufactured from one large-sized substrate (for example, 600 cm×720 cm). Next, the substrate is cut separately to take out a plurality of photo IC chips.

Figure 14A:
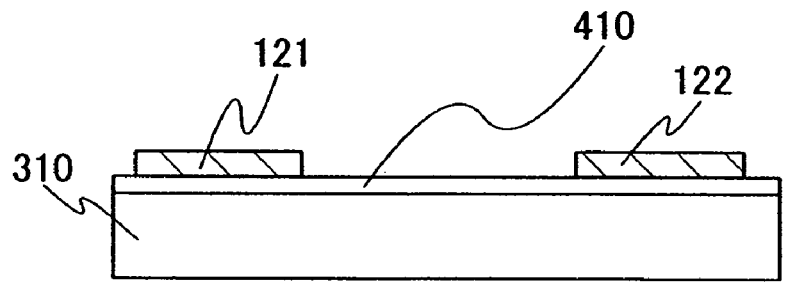
FIGS. 14A to 14C are views showing a manufacturing process of a semiconductor device of the invention.
Figure 14B:
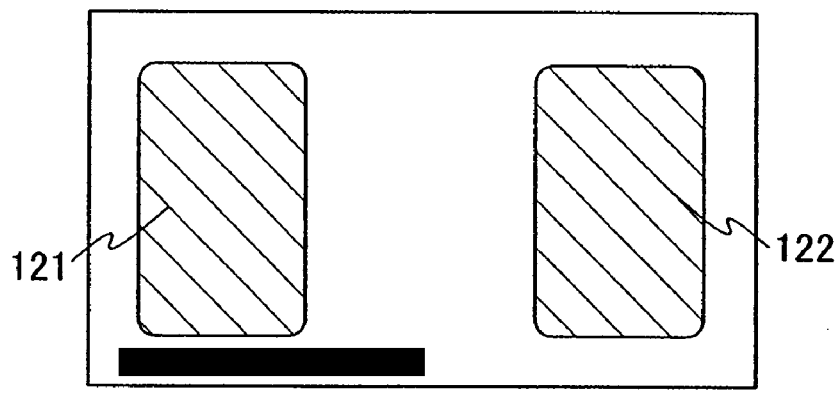
Figure 14C:
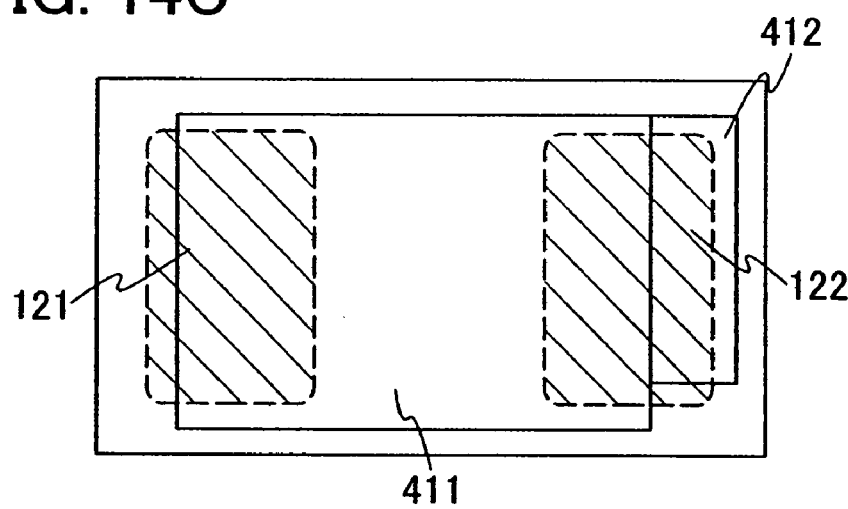

A cross-sectional view of one taken photo IC chip (2 mm×1.5 mm) is shown in FIG. 14A, a top view thereof is shown in FIG. 14B, and a bottom view thereof is shown in FIG. 14C. Note that the total thickness including thicknesses of a substrate 310, an element formation region 410, a terminal 121 and a terminal 122 is 0.8±0.05 mm in FIG. 14A.

In addition, in order to reduce the total thickness of an optical sensor chip, the substrate 310 may be ground to be thinned by CMP treatment or the like, and then, cut separately by a dicer to take out a plurality of optical sensor chips.

In FIG. 14B, each electrode size of the terminals 121 and 122 is 0.6 mm×1.1 mm, and the interval between the electrodes is 0.4 mm. In addition, in FIG. 14C, the area of a light receiving portion 411 is 1.57 mm$^2$. Moreover, an amplifier circuit portion 412 is provided with approximately 100 thin film transistors.

Lastly, the obtained optical sensor chip is mounted on a mounting surface of a substrate 360 (see FIG. 8A). Note that in order to connect the terminal 121 to an electrode 361 and the terminal 122 to an electrode 362, solders 364 and 363 are respectively used. The solders are formed in advance by a screen printing method or the like over the electrodes 361 and 362 of the substrate 360. Then, after the solder and the terminal electrode are made in an abutted state, solder reflow treatment is performed to mount the optical sensor chip on the substrate. The solder reflow treatment is performed at approximately 255 to 265° C. for about 10 seconds in an inert gas atmosphere, for example. Alternatively, a bump formed from a metal (such as gold or silver), a bump formed from a conductive resin, or the like can be used instead of the solder. Further alternatively, a lead-free solder may be used for mounting in consideration of environmental problems.

Thus, a semiconductor device can be manufactured. Note that in order to detect light, light may be blocked using a housing or the like in a portion where light does not enter the photoelectric conversion layer 111 from the substrate 310 side. Note that any material may be used for a housing as long as it has a function of blocking light; for example, a housing may be formed using a metal material, a resin material having a black pigment, or the like. With such a structure, a highly reliable semiconductor device having a function of detecting light can be manufactured.

In this embodiment, an example in which an amplifier circuit included in a semiconductor device is formed using an n-channel thin film transistor is described. Alternatively, a p-channel thin film transistor may be used. Note that a p-channel thin film transistor can be formed similarly to an n-channel thin film transistor except that a p-type impurity such as boron (B) is used instead of an impurity imparting one conductivity type to an island-shaped semiconductor region. Next, an example in which an amplifier circuit is formed using a p-channel thin film transistor is described.

Figure 15:
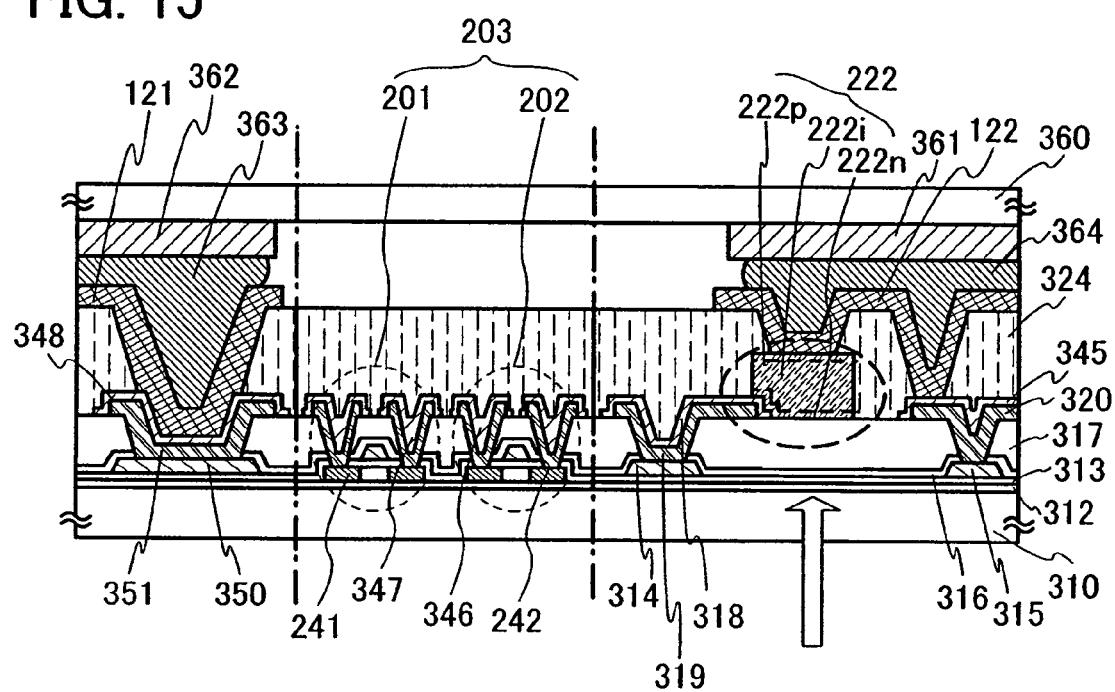
FIG. 15 is a cross sectional view showing a photoelectric conversion device of the invention. the invention.

FIG. 7 shows an example of an equivalent circuit diagram of a photoelectric conversion device in which an amplifier circuit such as a current mirror circuit is formed using a p-channel thin film transistor as described above, and FIG. 15 shows a cross sectional view of the photoelectric conversion device. In FIG. 15, the p-channel thin film transistors 201 and 202, and the photoelectric conversion element 204 in FIG. 7 are shown. Note that the same portions as those in FIGS. 8A and 8B and portions having similar functions to those in FIGS. 8A and 8B are denoted by common reference numerals, and specific description thereof is omitted. As described above, a p-type impurity such as boron (B) is introduced into an island-shaped semiconductor region of the thin film transistor 201 and an island-shaped semiconductor region of the thin film transistor 202, and a source region and a drain region 241 and a source region and a drain region 242 are formed for the thin film transistor 201 and the thin film transistor 202 respectively. Further, a photoelectric conversion layer 222 included in the photoelectric conversion element has a structure where an n-type semiconductor layer 222n, an i-type semiconductor layer 222i, and a p-type semiconductor layer 222p are sequentially stacked. Note that the n-type semiconductor layer 222n, the i-type semiconductor layer 222i, and the p-type semiconductor layer 222p can be formed using similar materials and manufacturing methods to those of the n-type semiconductor layer 111n, the i-type semiconductor layer 111i, and the p-type semiconductor layer 111p, respectively.

Note that this embodiment can be implemented in appropriate combination with any of the embodiment mode and the other embodiments.

Embodiment 3

In this embodiment, an example of a semiconductor device in which an amplifier circuit is formed using a bottom gate thin film transistor and a manufacturing method thereof is described with reference to FIGS. 16A to 18B.

Figure 16A:
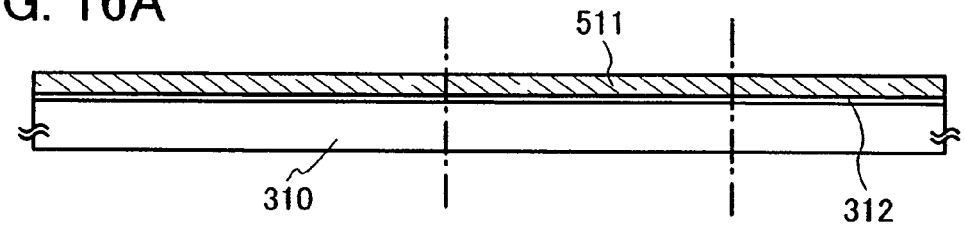
FIGS. 16A to 16E are views showing a manufacturing process of a semiconductor device of the invention.

First, a base insulating film 312 and a metal film 511 are formed over a substrate 310 (see FIG. 16A). As the metal film 511, in this embodiment, a stacked-layer film of tantalum nitride (TaN) having a thickness of 30 nm and tungsten (W) having a thickness of 370 nm is used, for example.

In addition, as the metal film 511, instead of the above film, a single-layer film formed from an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag) and copper (Cu), or an alloy material or a compound material containing the above element as its main component; or a single-layer film formed from nitride thereof such as titanium nitride, tungsten nitride, tantalum nitride, or molybdenum nitride may be used.

Note that the metal film 511 may be formed directly on the substrate 310 instead of formation of the base insulating film 312 over the substrate 310.

Figure 16B:
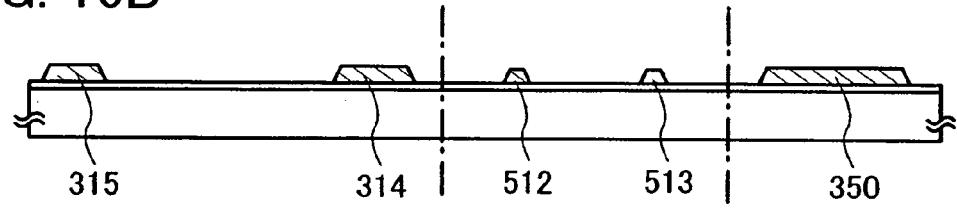
Figure 16C:
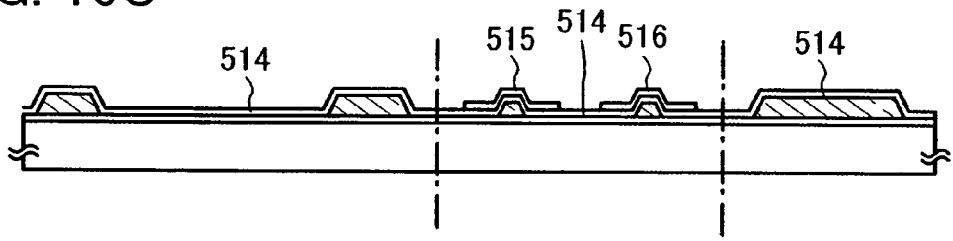

Next, the metal film 511 is patterned to form gate electrodes 512 and 513, wirings 314 and 315 and a terminal electrode 350 (see FIG. 16B).

Subsequently, a gate insulating film 514 which covers the gate electrodes 512 and 513, the wirings 314 and 315 and the terminal electrode 350 is formed. In this embodiment, the gate insulating film 514 is formed using an insulating film containing silicon as its main component, for example, a silicon oxide film containing nitrogen (composition ratio Si=32%, O=59%, N=7%, H=2%) having a thickness of 115 nm by a plasma CVD method.

Next, island-shaped semiconductor regions 515 and 516 are formed over the gate insulating film 514. The island-shaped semiconductor regions 515 and 516 may be formed by the similar material and manufacturing process to those of the island-shaped semiconductor regions 331 and 332 described in Embodiment 2 (see FIG. 16C).

Figure 16D:
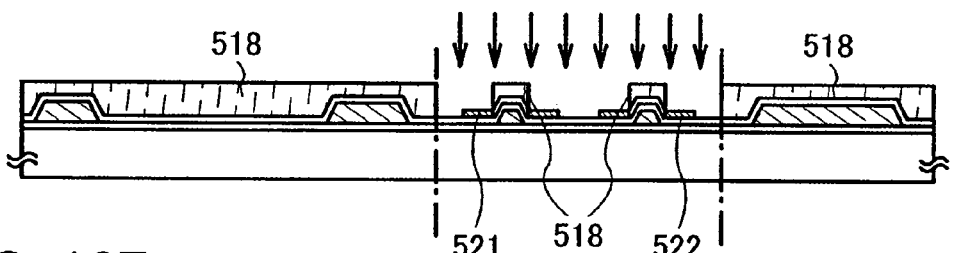

After the island-shaped semiconductor regions 515 and 516 are formed, a mask 518 is formed covering portions except for regions which becomes a source region and a drain region 521 of a thin film transistor 501 and a source region and a drain region 522 of a thin film transistor 502, and an impurity imparting one conductivity type is introduced (see FIG. 16D). As the one conductivity-type impurity, in a case of forming an n-channel thin film transistor, phosphorus (P) or arsenic (As) may be used as an n-type impurity, whereas in a case of forming a p-channel thin film transistor, boron (B) may be used as a p-type impurity. In this embodiment, phosphorus (P) which is an n-type impurity is introduced to the island-shaped semiconductor regions 515 and 516 to form the source region and the drain region 521 of the thin film transistor 501 and a channel formation region between the regions, and the source region and the drain region 522 of the thin film transistor 502 and a channel formation region between the regions. Note that a slight amount of an impurity element (boron or phosphorous) may be added to the channel formation region in order to control a threshold value of the thin film transistor, if necessary.

Figure 16E:
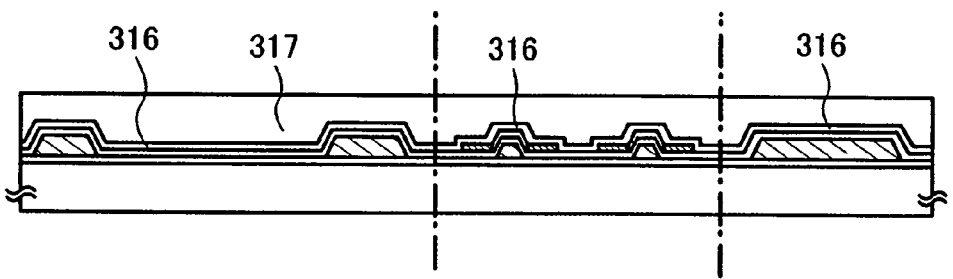

Next, the mask 518 is removed, and a first interlayer insulating film which is not shown, a second interlayer insulating film 316 and a third interlayer insulating film 317 are formed (see FIG. 16E). A material and a manufacturing process of the first interlayer insulating film, the second interlayer insulating film 316 and the third interlayer insulating film 317 are only necessary to be based on the description in Embodiment 2.

Contact holes are formed in the first interlayer insulating film, the second interlayer insulating film 316 and the third interlayer insulating film 317, and a metal film is formed, and further, the metal film is selectively etched to form the wiring 319, the connection electrode 320, the terminal electrode 351, the source electrode and the drain electrode 531 of the thin film transistor 501 and the source electrode and the drain electrode 532 of the thin film transistor 502. Then, the mask formed from a resist is removed. Note that the metal film of this embodiment is a stacked-layer film of a Ti film having a thickness of 100 nm, an Al film containing a very small amount of silicon having a thickness of 350 nm and a Ti film having a thickness of 100 nm.

In addition, instead of the wiring 319 and a protective electrode thereof 318; the connection electrode 320 and a protective electrode thereof 533; the terminal electrode 351 and a protective electrode thereof 538; the source electrode and the drain electrode 531 of the thin film transistor 501 and a protective electrode thereof 536; and the source electrode and the drain electrode 532 of the thin film transistor 502 and a protective electrode thereof 537, each wiring and electrode may be formed using a single-layer conductive film, in the same manner as the wiring 404, the connection electrode 405, the terminal electrode 401, the source electrode and the drain electrode 402 of the thin film transistor 112 and the source electrode and the drain electrode 403 of the thin film transistor 113 in FIG. 8B.

Figure 17A:
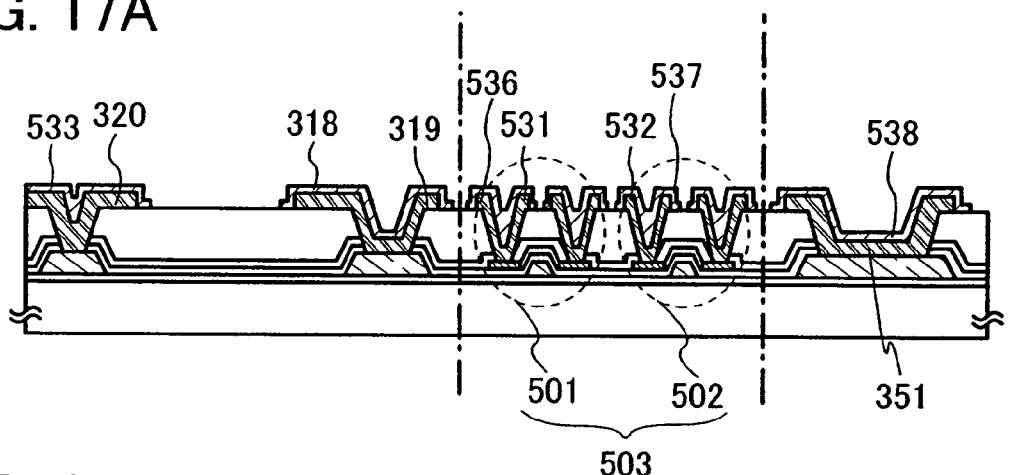
FIGS. 17A to 17C are views showing a manufacturing process of a semiconductor device of the invention.

Through the above process, bottom gate thin film transistors 501 and 502 included in an amplifier circuit 503 can be manufactured (see FIG. 17A).

Figure 17B:
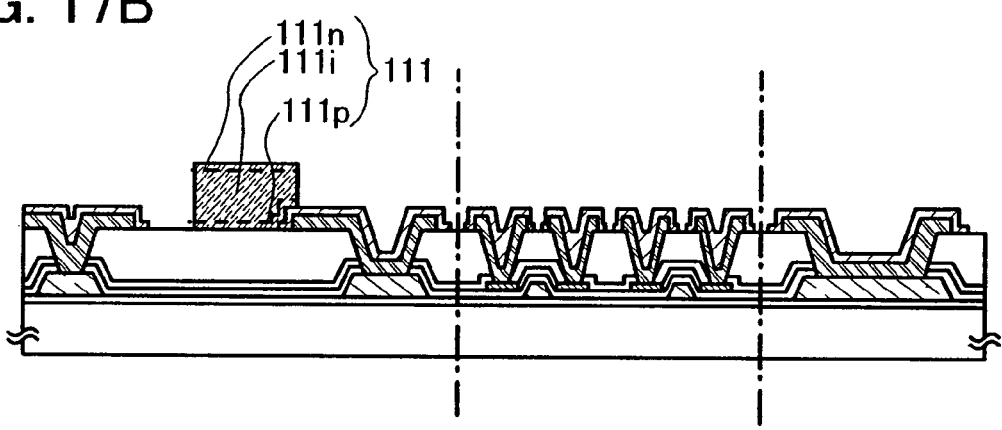

Subsequently, the photoelectric conversion layer 111 including the p-type semiconductor layer 111p, the i-type semiconductor layer 111i and the n-type semiconductor layer 111n is formed over the third interlayer insulating film 317 (see FIG. 17B). Embodiment Mode and Embodiment 2 may be referred to for a material, a manufacturing process and the like of the photoelectric conversion layer 111.

Figure 17C:
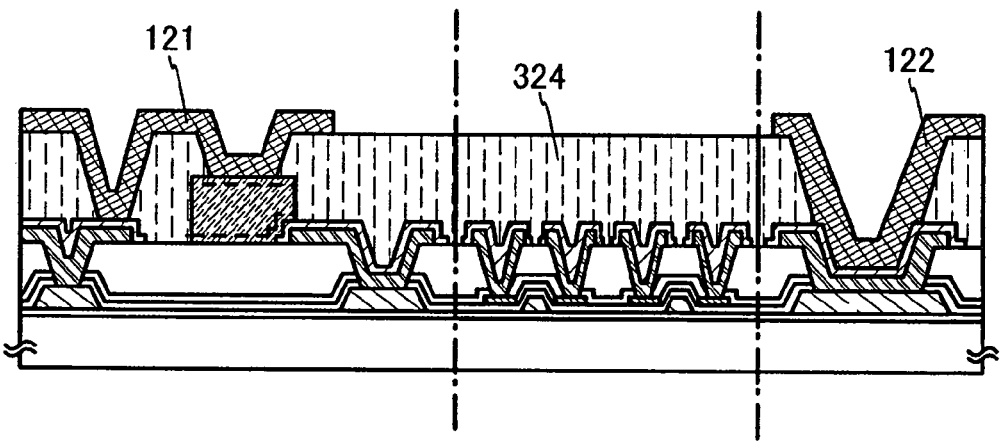

Next, the sealing layer 324 and the terminals 121 and 122 are formed (FIG. 17C). The terminal 121 is connected to the n-type semiconductor layer 111n, and the terminal 122 is formed by the same process as the terminal 121.

Moreover, the substrate 360 having the electrodes 361 and 362 is mounted using the solders 364 and 363. Note that the electrode 361 over the substrate 360 is mounted on the terminal 121 by the solder 364. In addition, the electrode 362 over the substrate 360 is mounted on the terminal 122 by the solder 363 (see FIG. 18A).

Figure 18A:
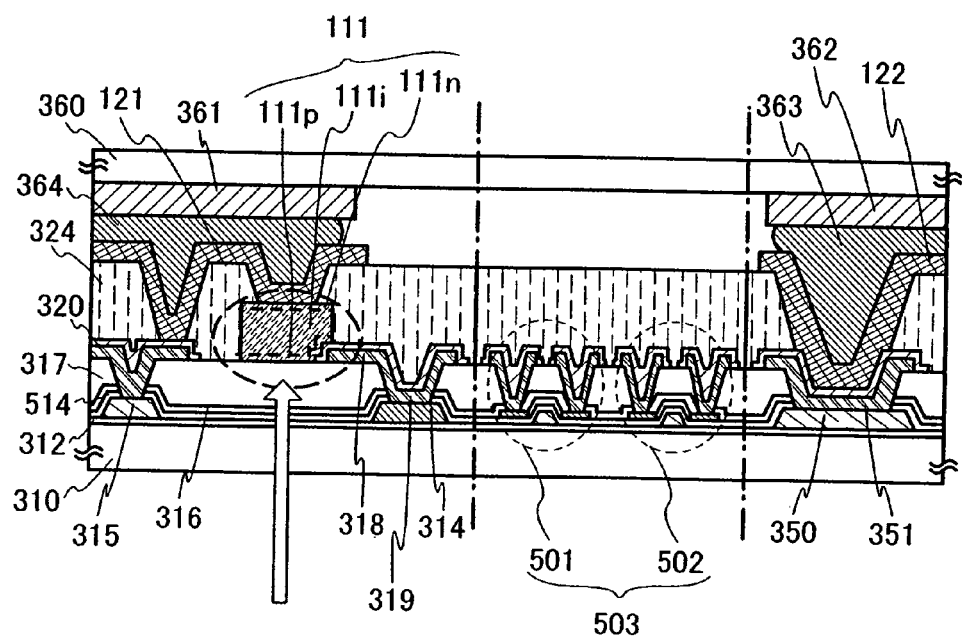
FIGS. 18A and 18B are views showing a manufacturing process of a semiconductor device of the invention.
Figure 18B:
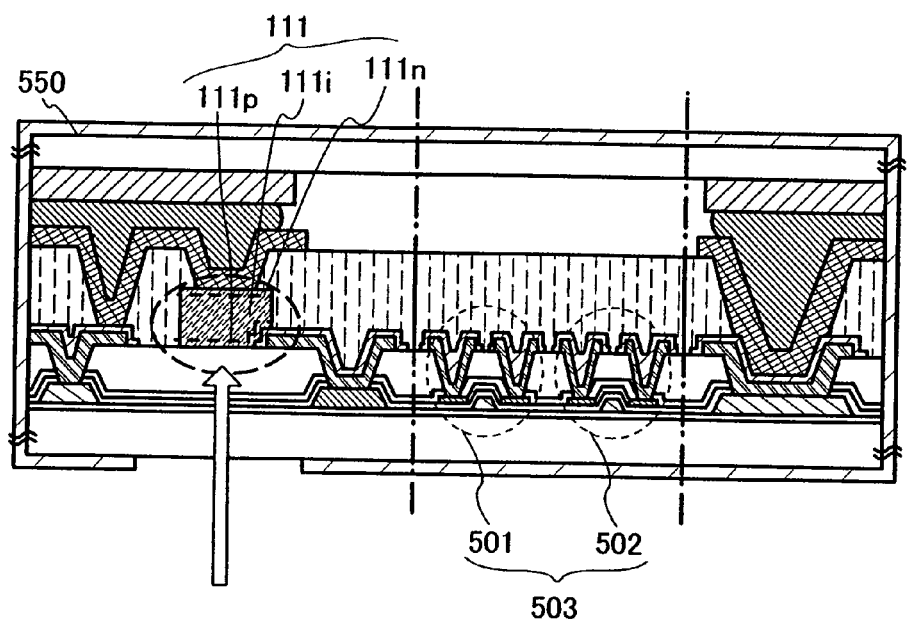

In a semiconductor device shown in FIG. 18A, light which enters the photoelectric conversion layer 111 enters mainly from the substrate 310 site; however, the invention is not limited to this. In addition, as shown in FIG. 18B, a housing 550 may be provided in a portion except a region where the photoelectric conversion layer 111 on the substrate 360 side is formed. Note that any material may be used for the housing 550 as long as it has a function of blocking light; for example, the housing 550 may be formed using a metal material, a resin material having a black pigment, or the like. With such a structure, a highly reliable semiconductor device having a function of detecting light can be manufactured.

Note that this embodiment can be implemented in appropriate combination with any of the embodiment mode and the other embodiments.

Embodiment 4

In this embodiment, a circuit which switches a bias is described as an example of the bias switching unit in FIG. 1A with reference to FIGS. 19 to 23B.

Figure 19:
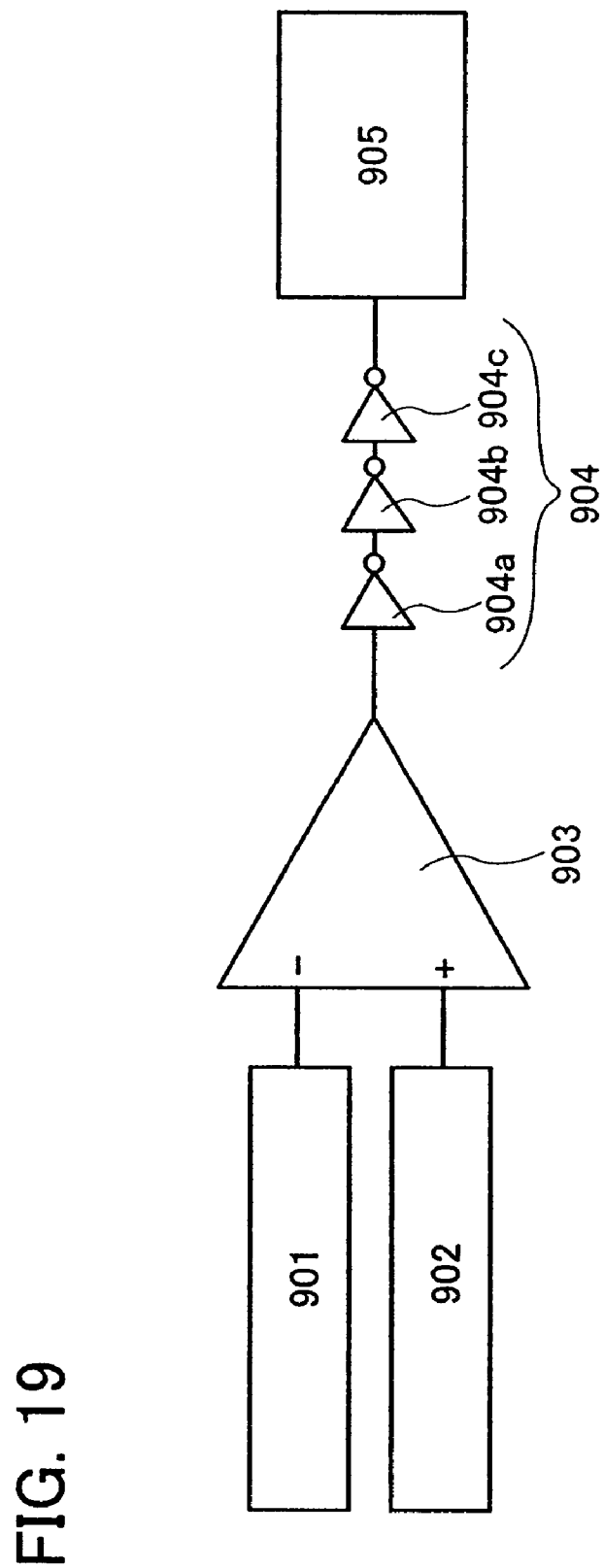
FIG. 19 is a view showing a bias switching unit.

The circuit shown in FIG. 19 reverses a bias to be applied to the photoelectric conversion device when the output voltage, which is obtained by outputting the current obtained from the photoelectric conversion device 101 in FIGS. 1A and 1B as a voltage, reaches a certain value. In other words, the circuit reverses a bias at a predetermined level of illuminance. Note that the circuit shown in FIG. 19 reverses the bias in a case where the output voltage exceeds Vr, having the reference voltage Vr as a boundary.

Figure 20:
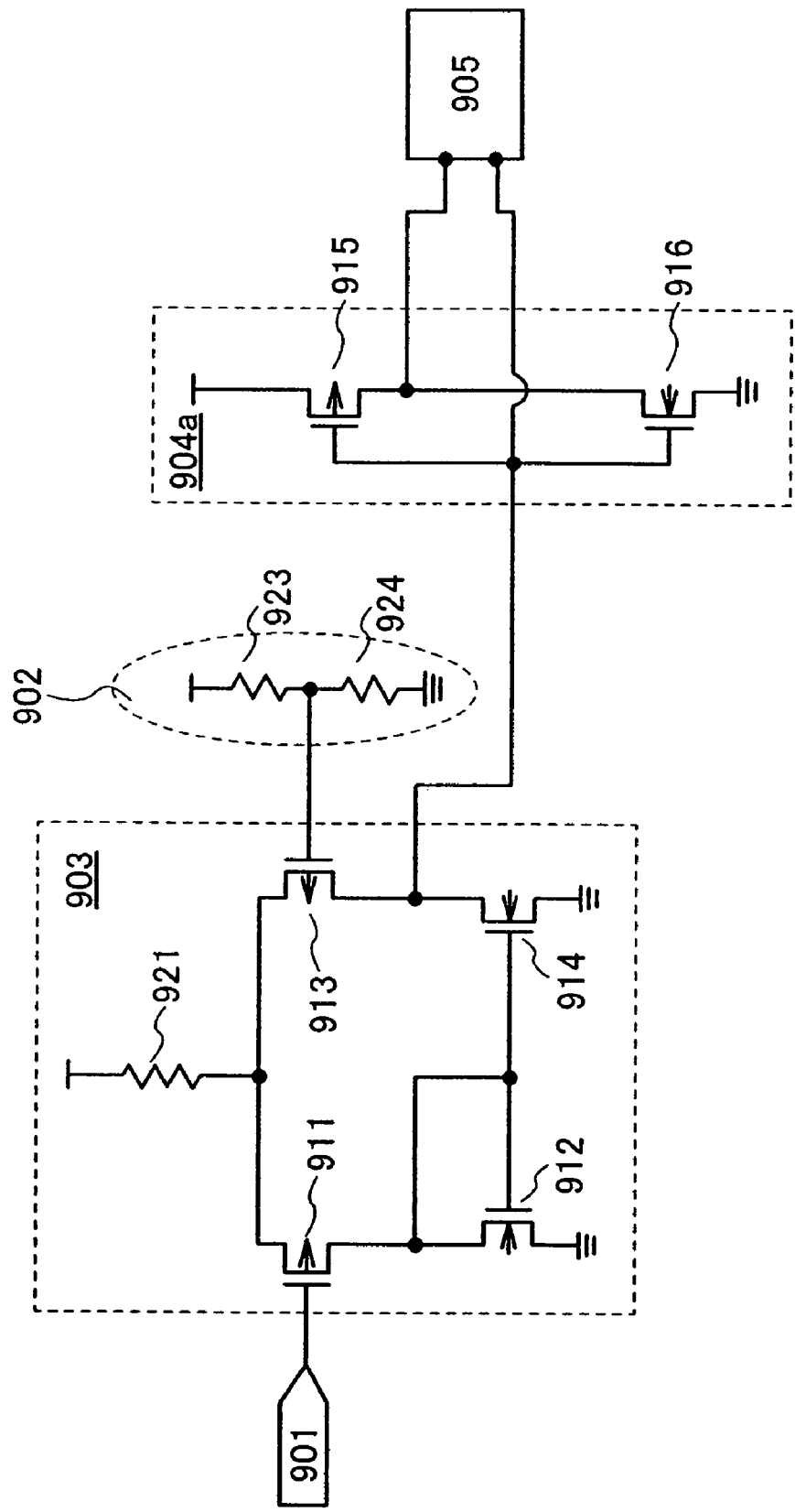
FIG. 20 is a diagram showing a bias switching unit.
Figure 21A:
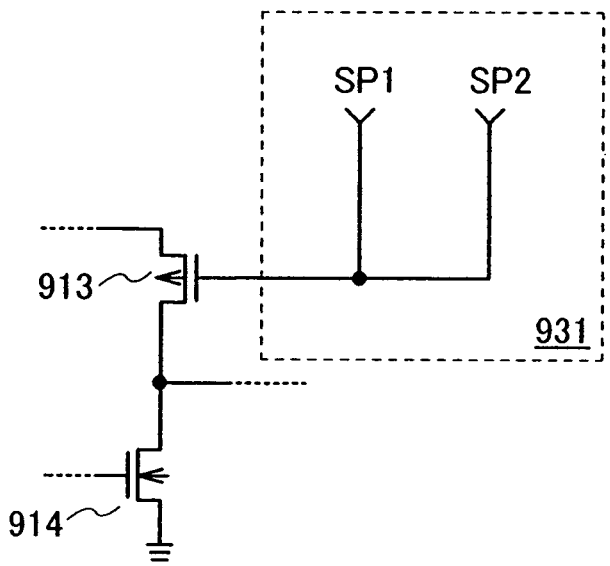
FIGS. 21A and 21B are diagrams each showing a bias switching unit.
Figure 21B:
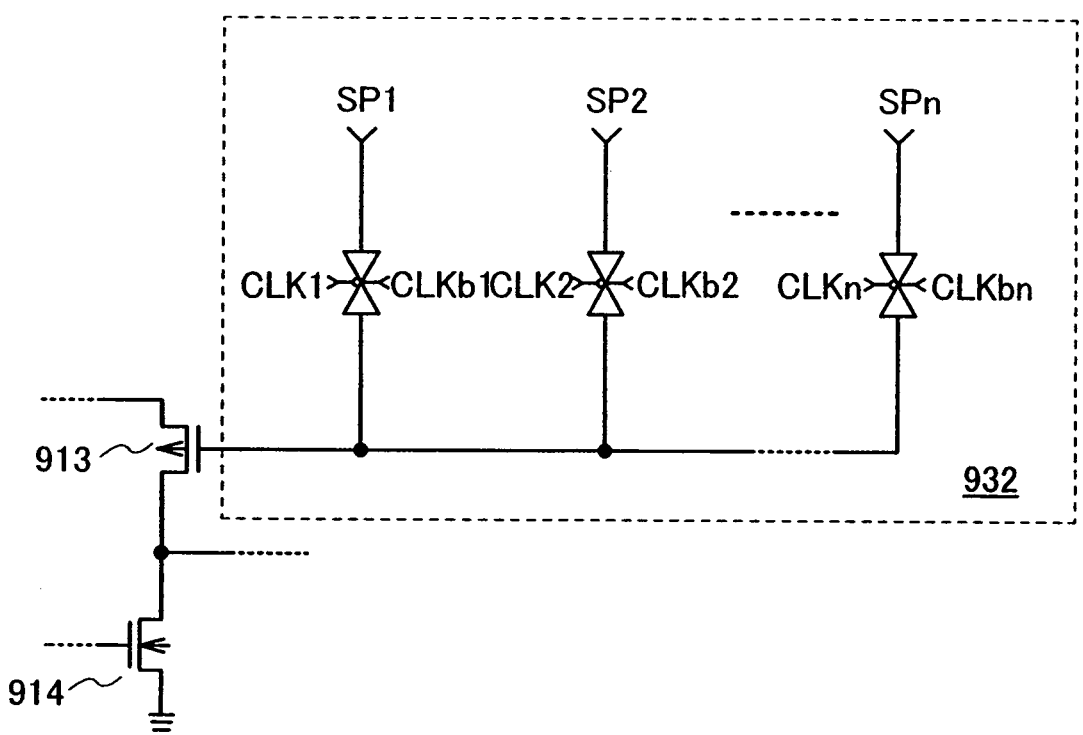

In FIGS. 19 and 20, a reference numeral 901 denotes a photo sensor output $V_{PS}$, 902 denotes a reference voltage generating circuit to determine the reference voltage Vr, 903 denotes a comparator, and 904 denotes an output buffer having a first stage 904a, a second stage 904b and a third stage 904c. Note that although only three stages of the output buffer are described here, four or more stages of the output buffer may be provided instead, or alternatively, only one stage of the output buffer may be provided. Note that the photo sensor output $V_{PS}$ corresponds to an output obtained from the terminal $V_0$ in FIG. 1A. Further, the comparator 903 and the output buffer 904 correspond to the bias switching unit 102 and the power source 103 in FIG. 1A respectively, and a reference numeral 905 corresponds to the photoelectric conversion element 101 and the resistor 104.

FIG. 20 shows a specific circuit configuration of FIG. 19, and the comparator 903 has p-channel thin film transistors 911 and 913, n-channel thin film transistors 912 and 914 and a resistor 921. Also, the reference voltage generating circuit 902 has resistors 923 and 924, and determines the reference voltage Vr by the resistors.

In addition, in FIG. 20, only the first stage 904*a* of the output buffer 904 is shown, and the first stage 904*a* includes a p-channel thin film transistor 915 and an n-channel thin film transistor 916. Note that in FIG. 20, an n-channel thin film transistor is a single gate thin film transistor which has one gate electrode; however, in order to reduce an off current, the n-channel thin film transistor may be formed of a multi gate thin film transistor which has a plurality of gate electrodes, for example, a double gate thin film transistor which has two gate electrodes. Note that the other stages may be formed with similar circuits to 904*a*.

Figure 22A:
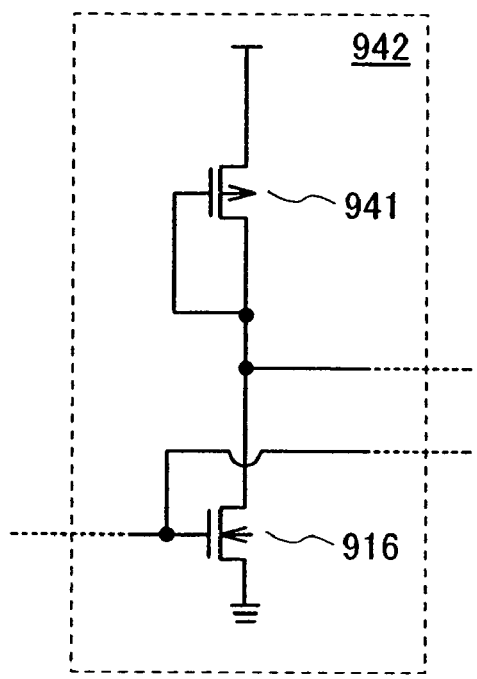
FIGS. 22A and 22B are diagrams each showing a bias switching unit.
Figure 22B:
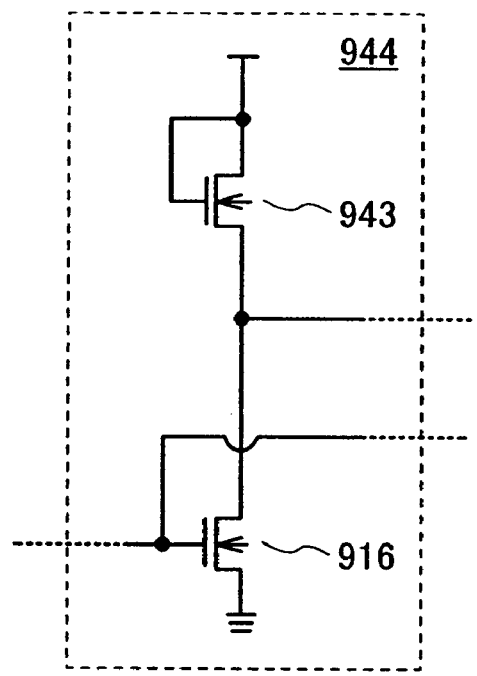
Figure 23A:
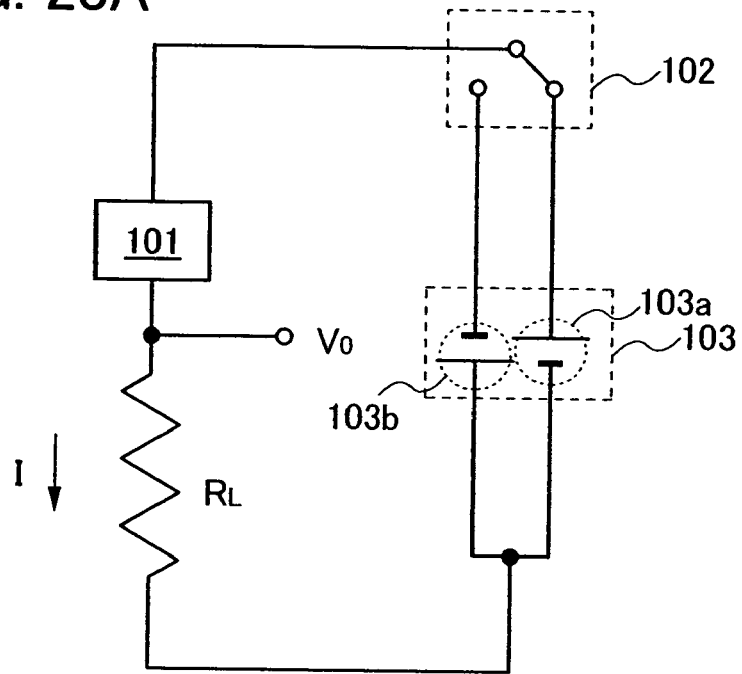
Figure 23B:
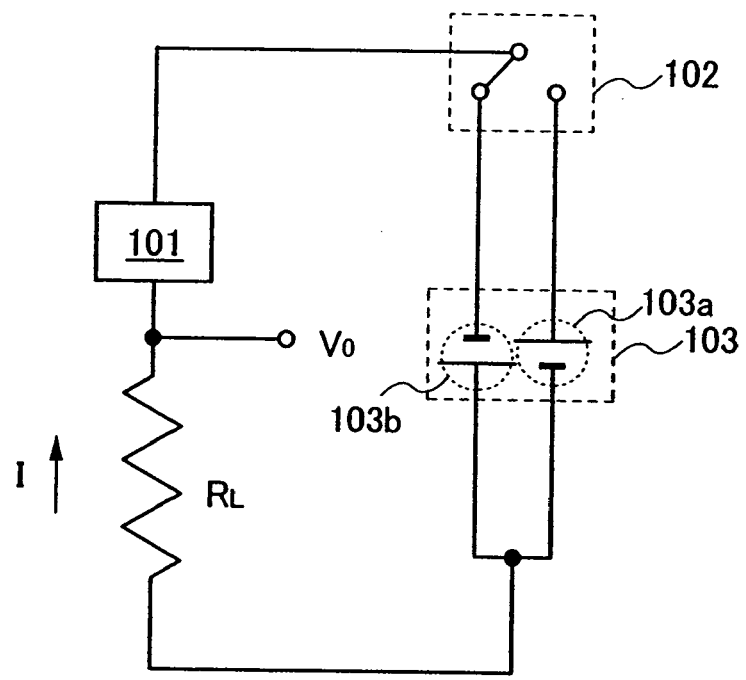

In FIG. 20, the one stage of the output buffer 904 may be substituted by a circuit 942 shown in FIG. 22A or a circuit 944 shown in FIG. 22B. The circuit 942 shown in FIG. 22A includes an n-channel thin film transistor 916 and a p-channel thin film transistor 941, and the circuit shown in FIG. 22B includes n-channel thin film transistors 916 and 943.

Note that the output voltage, which is obtained by outputting the current obtained from the photoelectric conversion device as a voltage, may be used for the photo sensor output $V_{PS}$, or a voltage in which the output voltage is amplified in an amplifier circuit may be used instead.

In FIG. 20, the reference voltage Vr is determined by the reference voltage generating circuit. In a case where other reference voltage is necessary to be obtained, the reference voltage Vr may be directly inputted from an external circuit 931 (see FIG. 21A), or inputted from a circuit 932 selecting several input voltages with use of a selector (an analog switch or the like) (see FIG. 21B).

Note that in the circuit shown in FIG. 20, the reference voltage Vr is necessary to be equal to or higher than a threshold voltage (Vth≦Vr is satisfied when the threshold voltage is Vth) of a thin film transistor which is included in the comparator. It is necessary that the reference voltage or the photo sensor output voltage be adjusted so as to meet this condition.

The photo sensor output $V_{PS}$ is inputted to the gate electrode of the p-channel thin film transistor 911 of the comparator 903, and is compared with a voltage value from the reference voltage generating circuit 902. In a case where the photo sensor output $V_{PS}$ is lower than a voltage value from the reference voltage generating circuit, the photo sensor output $V_{PS}$ is connected to a power source 103*a* of a power source 103, and a current flows in a direction shown in FIG. 23A. Meanwhile, in a case where the photo sensor output $V_{PS}$ is higher than a voltage value from the reference voltage generating circuit, the photo sensor output $V_{PS}$ is connected to a power source 103*b* of the power source 103, and a current flows in a direction shown in FIG. 23B.

By reversal of a bias to be applied to the photoelectric conversion device with use of the bias switching unit described above, a wider range of illuminance can be detected without expansion of a range of an output voltage or output current.

Note that this embodiment can be implemented in appropriate combination with any of the embodiment mode and the other embodiments.

Embodiment 5

In this embodiment, an example in which a semiconductor device obtained by the present invention is incorporated in various electronic devices as an optical sensor is described. As electronic appliances to which the present invention is applied, a computer, a display, a mobile phone, a TV set and the like are given. Specific examples of those electronic appliances are shown in FIGS. 24 to 28.

Figure 24:
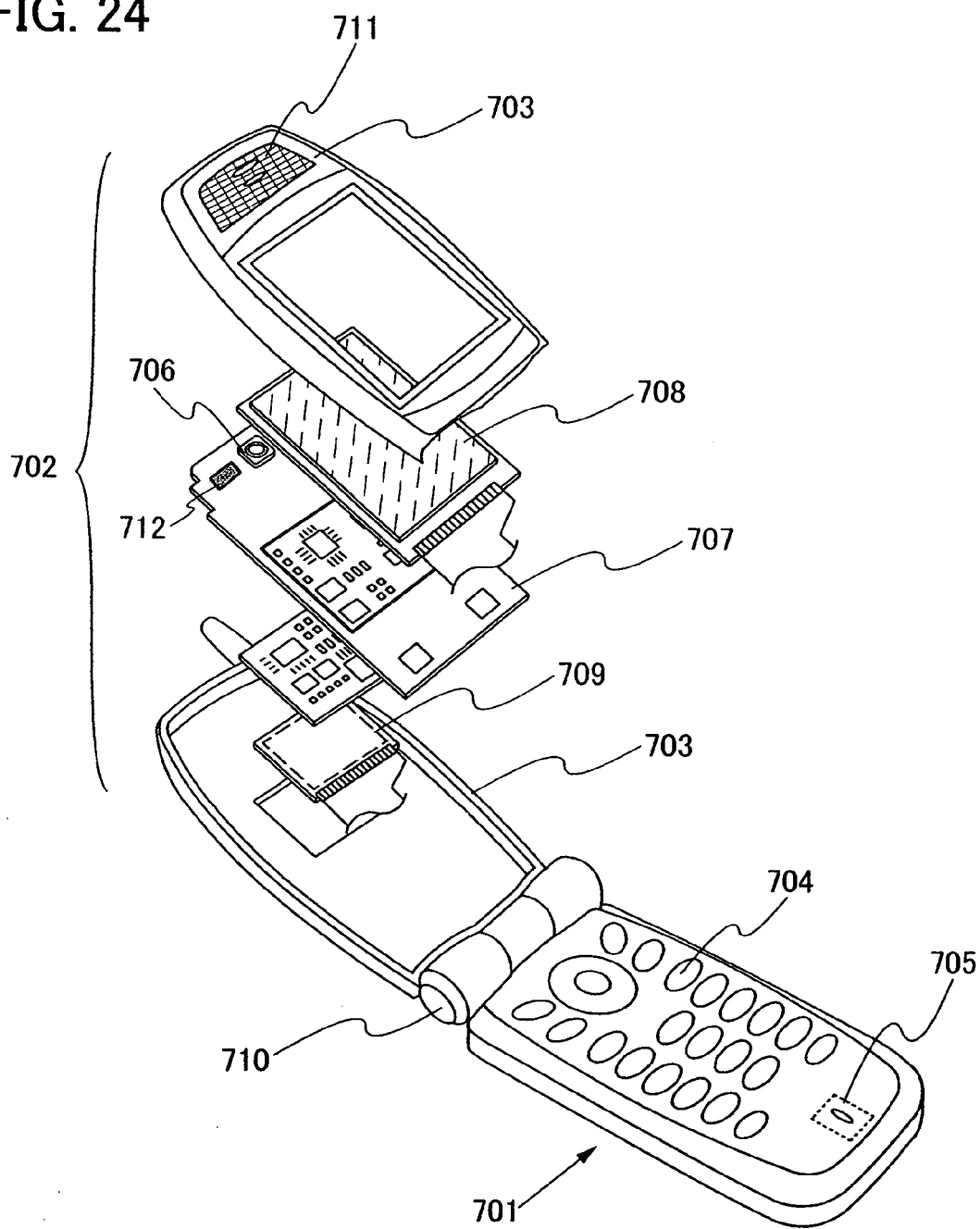
FIG. 24 is a view showing a device on which a semiconductor device of the invention is mounted.

FIG. 24 shows an example of a mobile phone to which the present invention is applied, and which includes a main body (A) 701, a main body (B) 702, a housing 703, operation keys 704, an audio output portion 705, an audio input portion 706, a circuit substrate 707, a display panel (A) 708, a display panel (B) 709, a hinge 710, a light-transmitting material portion 711 and an optical sensor 712. The present invention can be applied to the optical sensor 712.

The optical sensor 712 senses light which is transmitted through the light-transmitting material portion 711, controls luminance of the display panel (A) 708 and the display panel (B) 709 in accordance with illuminance of sensed external light, or controls illumination of the operation keys 704 in accordance with illuminance obtained by the optical sensor 712. Accordingly, power consumption of a mobile phone can be reduced.

Figure 25A:
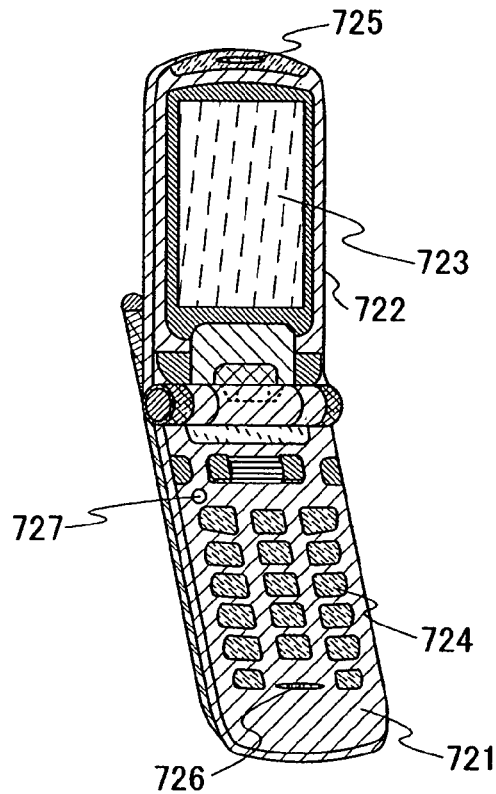
FIGS. 25A and 25B are views each showing a device on which a semiconductor device of the invention is mounted.
Figure 25B:
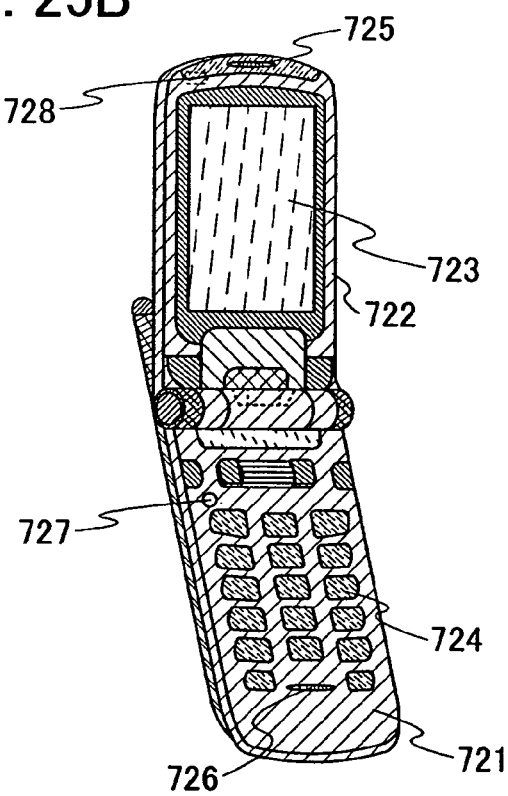

FIGS. 25A and 25B show other examples of a mobile phone. In FIGS. 25A and 25B, reference numeral 721 denotes a main body, 722 denotes a housing, 723 denotes a display panel, 724 denotes operation keys, 725 denotes an audio output portion, 726 denotes an audio input portion, and 727 and 728 denote optical sensors.

In a mobile phone shown in FIG. 25A, luminance of the display panel 723 and the operation keys 724 can be controlled by sensing of external light by the optical sensor 727 provided for the main body 721, to which the present invention is applied.

Also, in a mobile phone shown in FIG. 25B, in addition to the structure of FIG. 25A, the optical sensor 728 is provided inside the main body 721. By the optical sensor 728, luminance of backlight provided for the display panel 723 can be detected and controlled. Therefore, power consumption can be further reduced.

Figure 26A:
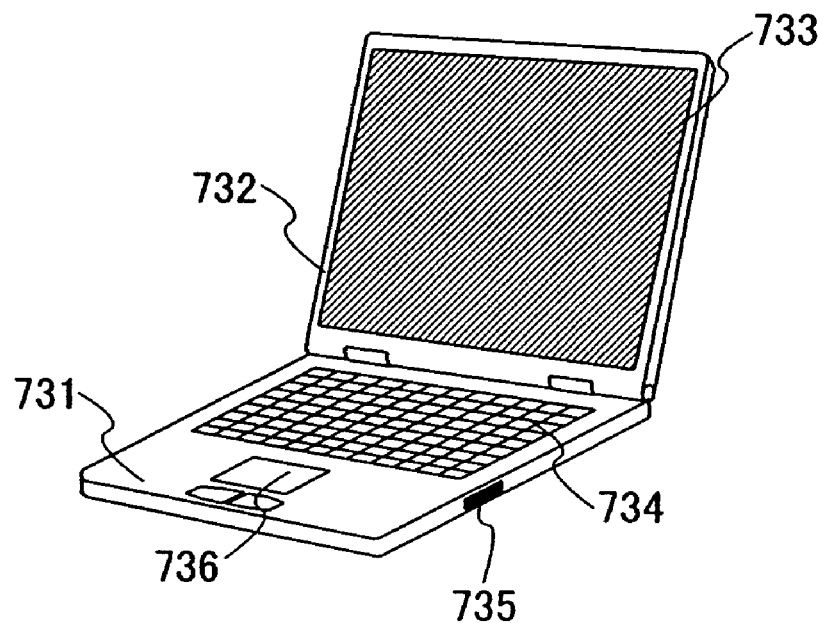
FIGS. 26A and 26B are views each showing a device on which a semiconductor device of the invention is mounted.
Figure 26B:
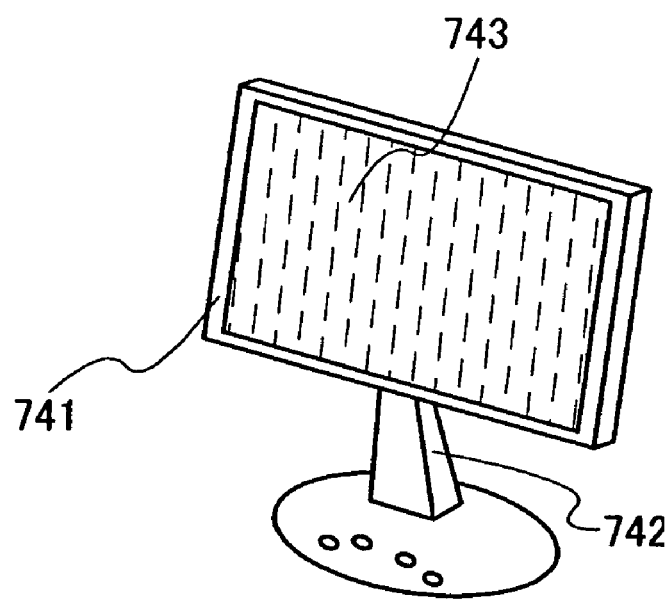

FIG. 26A shows a computer including a main body 731, a housing 732, a display portion 733, a keyboard 734, an external connection port 735, a pointing device 736 and the like. FIG. 26B shows a display device, and a television receiver or the like corresponds to this. The display device includes a housing 741, a supporting base 742, a display portion 743 and the like.

Figure 27:
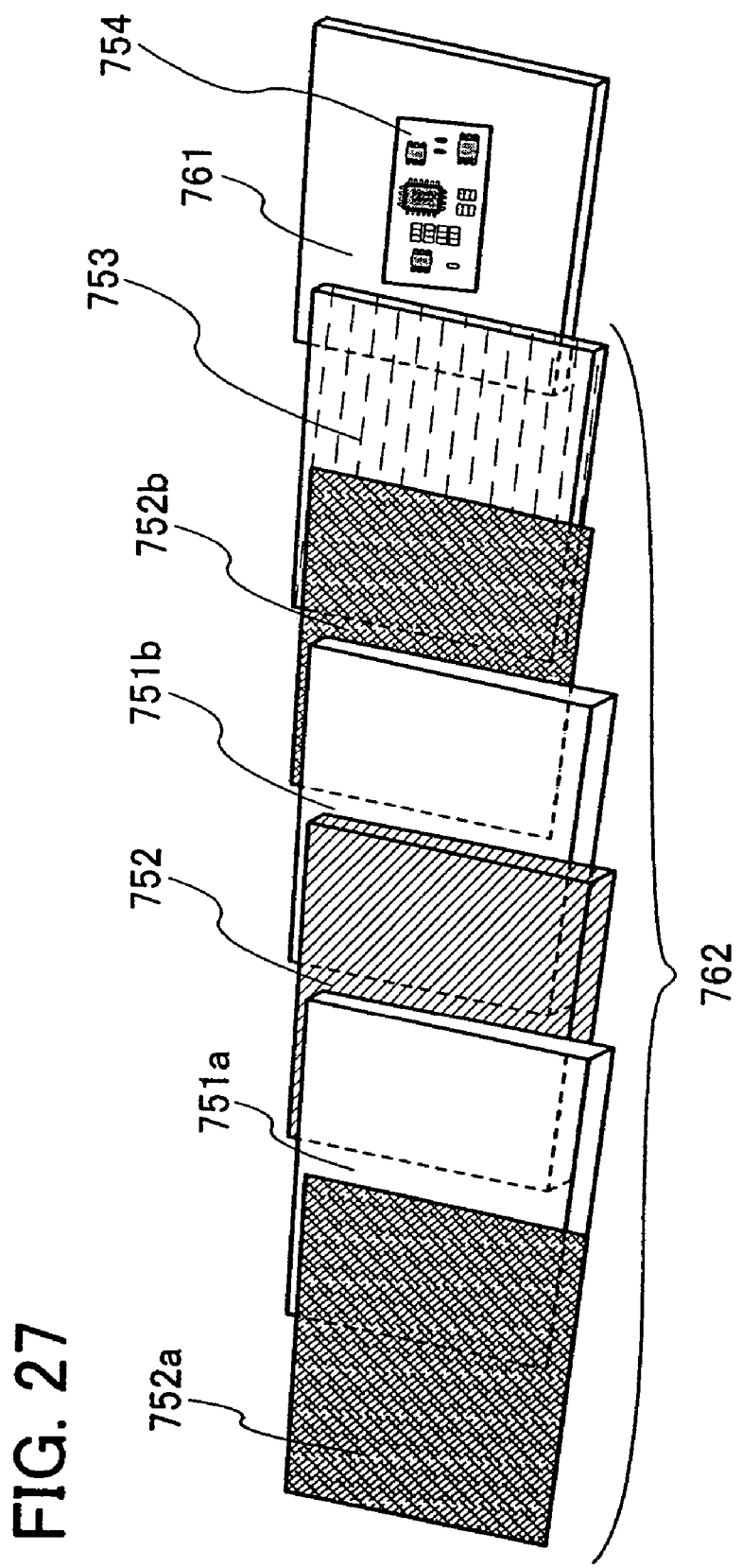
FIG. 27 is a view showing a device on which a semiconductor device of the invention is mounted.

As the display portion 733 provided in the computer of FIG. 26A and the display portion 743 of the display device shown in FIG. 26B, a specific structure in a case of using a liquid crystal panel is shown in FIG. 27. A liquid crystal panel 762 shown in FIG. 27 is incorporated in a housing 761, and includes substrates 751*a* and 751*b*, a liquid crystal layer 752 sandwiched between the substrates 751*a* and 751*b*, polarizing filters 752*a* and 752*b*, a backlight 753, and the like. An optical sensor portion 754 is formed for the housing 761.

The optical sensor portion 754 which is manufactured using the present invention detects the light amount from the backlight 753, and luminance of the liquid crystal panel 762 is adjusted when information thereof is fed back.

Figure 28A:
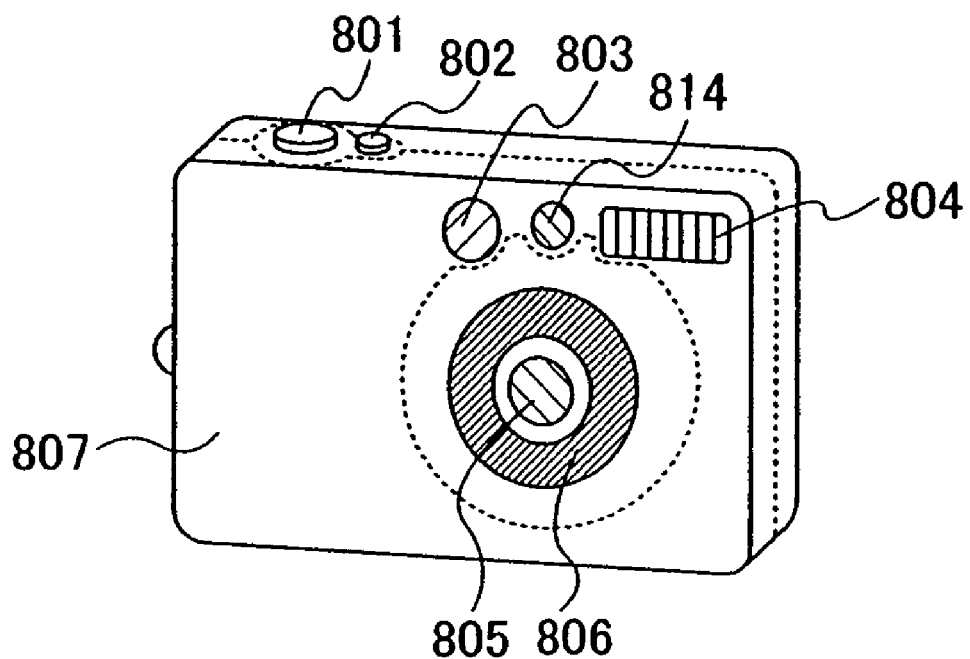
FIGS. 28A and 28B are views showing a device on which a semiconductor device of the invention is mounted.
Figure 28B:
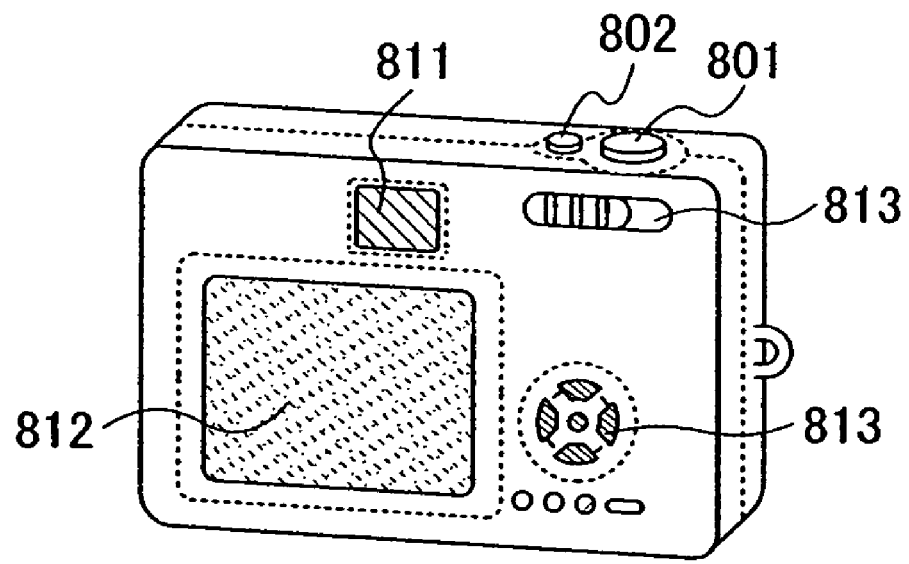

FIGS. 28A and 28B are views each showing an example in which the optical sensor of the present invention is incorporated in a camera such as a digital camera. FIG. 28A is a front perspective view of the digital camera, and FIG. 28B is a back perspective view of the digital camera. In FIG. 28A, the digital camera is provided with a release button 801, a main switch 802, a finder window 803, a flush 804, a lens 805, a lens barrel 806, a housing 807, and an optical sensor 814. In addition, in FIG. 28B, a finder eyepiece window 811, a monitor 812, and operation buttons are provided.

When the release button 801 is pressed down halfway, a focusing adjusting mechanism and an exposure adjusting mechanism are operated, and when the release button is pressed down fully, a shutter is opened. The main switch 802 switches ON or OFF of a power source of a digital camera by being pressed or rotated. The finder window 803 is placed at the upper portion of the lens 805 of a front side of the digital camera, and is a device for recognizing an area which is taken or a focus position from the finder eyepiece window 811 shown in FIG. 28B. The flush 804 is placed at the upper portion of the front side of the digital camera, and when object luminance is low, supporting light is emitted at the same time as the release button is held down so that the shutter is opened. The lens 805 is placed at the front face of the digital camera. The lens is formed of a focusing lens, a zoom lens, or the like, and forms a photographing optical system with a shutter and an aperture that are not shown. In addition, an image pickup device such as CCD (Charge Coupled Device) is provided at the rear of the lens. The lens barrel 806 moves a lens position to adjust the focus of the focusing lens, the zoom lens, and the like. When shooting, the lens barrel is slid out to move the lens 805 forward. In addition, when carrying it, the lens 805 is moved backward to be compact. Note that a structure is employed in this embodiment, in which the lens barrel is slid out so that the object can be shot by being zoomed; however, a structure is not limited thereto. Instead, a structure may be employed, in which zoom shooting can be conducted without the lens barrel being slid out by a photographing optical system inside the housing 807. The finder eyepiece window 811 is provided at the upper portion of the rear surface of the digital camera, for looking through when checking an area which is taken or a focus point. The operation buttons 813 are buttons for various functions that are provided at the rear surface of the digital camera and include a set up button, a menu button, a display button, a functional button, a selection button and the like.

When the optical sensor to which the present invention is applied is incorporated in the camera shown in FIGS. 28A and 28B, the optical sensor can detect the light intensity and whether or not light exists, and accordingly, an exposure adjustment or the like of the camera can be performed.

In addition, the optical sensor of the present invention can be applied to other electronic appliances such as a projection TV and a navigation system. That is, the optical sensor of the present invention can be used for any device which is necessary to detect light. A result of light detection is fed back to an illumination control device or the like included in an electronic appliance, whereby power consumption can be reduced.

Note that this embodiment can be implemented in appropriate combination with any of the embodiment mode and the other embodiments.

This application is based on Japanese Patent Application serial no. 2006-122993 filed in Japan Patent Office on 27th, Apr., 2006, the entire contents of which are hereby incorporated by reference.

The invention claimed is:

1. A semiconductor device having an illuminance detecting function, comprising:
a photoelectric conversion device including a photoelectric conversion element and an amplifier circuit electrically connected to the photoelectric conversion element; and
a bias switching unit configured to reverse a bias to be applied to the photoelectric conversion device,
wherein the amplifier circuit has two or more transistors including at least a first transistor,
wherein a gate electrode of the first transistor is electrically connected to a first electrode of the first transistor through the photoelectric conversion element,
wherein the photoelectric conversion element senses incident light, and
wherein the bias switching unit switches detection by a current generated in the photoelectric conversion element and detection by a voltage generated in the photoelectric conversion element which is applied between the gate and the first electrode of the first transistor, by reversing the bias at a predetermined level of illuminance.

2. The semiconductor device according to claim 1, wherein the amplifier circuit has a plurality of the first transistors.

3. The semiconductor device according to claim 1, wherein the photoelectric conversion element has a p-type semiconductor layer, an n-type semiconductor layer, and an i-type semiconductor layer provided between the p-type semiconductor layer and the n-type semiconductor layer.

4. An electronic appliance comprising the semiconductor device according to claim 1.

5. A semiconductor device having an illuminance detecting function, comprising:
a photoelectric conversion device including a photoelectric conversion element and an amplifier circuit electrically connected to the photoelectric conversion element; and
a bias switching unit configured to reverse a bias to be applied to the photoelectric conversion device,
wherein the amplifier circuit has two or more transistors including at least a first transistor,
wherein the photoelectric conversion element senses incident light,
wherein the light is detected by a current generated in the photoelectric conversion element when an illuminance level is a predetermined level or lower,
wherein the light is detected by application of a voltage generated in the photoelectric conversion element between a gate and a source of the first transistor when an illuminance level is higher than the predetermined level, and
wherein the bias switching unit reverses the bias at the predetermined level of illuminance.

6. The semiconductor device according to claim 5, wherein the amplifier circuit has a plurality of the first transistors.

7. The semiconductor device according to claim 5, wherein the photoelectric conversion element has a p-type semiconductor layer, an n-type semiconductor layer, and an i-type semiconductor layer provided between the p-type semiconductor layer and the n-type semiconductor layer.

8. An electronic appliance comprising the semiconductor device according to claim 5.

9. A semiconductor device having an illuminance detecting function, comprising:
a photoelectric conversion device including a photoelectric conversion element and an amplifier circuit electrically connected to the photoelectric conversion element; and a bias switching unit configured to reverse a bias to be applied to the photoelectric conversion device, wherein the amplifier circuit has two or more transistors including at least a first transistor, wherein a gate electrode of the first transistor is electrically connected to a first electrode of the first transistor through the photoelectric conversion element, wherein the photoelectric conversion element senses incident light, wherein the light is detected by a current generated in the photoelectric conversion element when an illuminance level is a predetermined level or lower, wherein the light is detected by application of a voltage generated in the photoelectric conversion element between the gate and the first electrode of the first transistor when an illuminance level is higher than the predetermined level, and wherein the bias switching unit reverses the bias at the predetermined level of illuminance.

10. The semiconductor device according to claim 9, wherein the amplifier circuit has a plurality of the first transistors.

11. The semiconductor device according to claim 9, wherein the photoelectric conversion element has a p-type semiconductor layer, an n-type semiconductor layer, and an i-type semiconductor layer provided between the p-type semiconductor layer and the n-type semiconductor layer.

12. An electronic appliance comprising the semiconductor device according to claim 9.

13. A semiconductor device having an illuminance detecting function, comprising:

a photoelectric conversion device including a photoelectric conversion element and an amplifier circuit electrically connected to the photoelectric conversion element; and a bias switching unit configured to reverse a bias to be applied to the photoelectric conversion device, wherein the amplifier circuit has at least a first transistor and a second transistor, wherein the bias is applied through a first terminal and a second terminal of the photoelectric conversion device, wherein the first terminal is electrically connected to a first electrode of the second transistor, a gate electrode of the second transistor and a gate electrode of the first transistor through the photoelectric conversion element, wherein the first terminal is electrically connected to a first electrode of the first transistor, wherein the second terminal is electrically connected to a second electrode of the first transistor and a second electrode of the second transistor, wherein the photoelectric conversion element senses incident light, wherein the light is detected by a current generated in the photoelectric conversion element when an illuminance level is a predetermined level or lower;

wherein the light is detected by a voltage generated in the photoelectric conversion element when an illuminance level is higher than the predetermined level, and wherein the bias switching unit reverses the bias at the predetermined level of illuminance.

14. The semiconductor device according to claim 13, wherein the amplifier circuit has a plurality of the first transistors.

15. The semiconductor device according to claim 13, wherein the photoelectric conversion element has a p-type semiconductor layer, an n-type semiconductor layer, and an i-type semiconductor layer provided between the p-type semiconductor layer and the n-type semiconductor layer.

16. An electronic appliance comprising the semiconductor device according to claim 13.

* * * * *